(12) United States Patent
Ambo et al.

(10) Patent No.: US 8,269,116 B2
(45) Date of Patent: Sep. 18, 2012

(54) CIRCUIT BOARD CASE WITH ELECTRIC CONNECTOR AND ELECTRONIC UNIT PROVIDED WITH THE SAME

(76) Inventors: Tsugio Ambo, Tokyo (JP); Katsuji Shimazawa, Tokyo (JP); Yoshikazu Tanaka, Tokyo (JP); Tomohiko Muto, Tokyo (JP)

( * ) Notice: Subject to any disclaimer, the term of this patent is extended or adjusted under 35 U.S.C. 154(b) by 215 days.

(21) Appl. No.: 12/864,177

(22) PCT Filed: Jan. 15, 2009

(86) PCT No.: PCT/JP2009/000131
§ 371 (c)(1),
(2), (4) Date: Jul. 22, 2010

(87) PCT Pub. No.: WO2009/093424
PCT Pub. Date: Jul. 30, 2009

(65) Prior Publication Data
US 2010/0300723 A1    Dec. 2, 2010

(30) Foreign Application Priority Data

Jan. 24, 2008  (JP) ................. 2008-014078
Apr. 25, 2008  (JP) ................. 2008-115427

(51) Int. Cl.
*H05K 7/02* (2006.01)
(52) U.S. Cl. .......... 174/541; 174/59; 439/76.2
(58) Field of Classification Search .......... 174/541, 174/520, 535, 59; 439/76.2
See application file for complete search history.

(56) References Cited

U.S. PATENT DOCUMENTS

| | | | |
|---|---|---|---|
| 6,445,568 B1 * | 9/2002 | Baur et al. | 361/600 |
| 6,560,115 B1 * | 5/2003 | Wakabayashi et al. | 361/728 |
| 6,858,801 B1 * | 2/2005 | Brown | 174/560 |
| 7,066,660 B2 * | 6/2006 | Ellison | 385/92 |
| 7,067,734 B2 * | 6/2006 | Abe et al. | 174/359 |

FOREIGN PATENT DOCUMENTS

| | | |
|---|---|---|
| JP | 11-284386 | 10/1999 |
| JP | 2000-092652 A | 3/2000 |
| JP | 2007-280795 A | 10/2007 |

* cited by examiner

*Primary Examiner* — Hung Ngo
(74) *Attorney, Agent, or Firm* — Knobbe Martens Olson & Bear LLP

(57) ABSTRACT

A circuit board case with an electrical connector comprises a case member having formed thereon a connector mating portion, and a connection member accommodated in the case member and mounted on the connector mating portion to electrically connect the counterpart connector and the circuit board. The connection member comprises a terminal provided with a first bar portion and a second bar portion, and a first fixing member which holds the first bar portion of the terminal and is mounted on the connector mating portion of the case member to fix the terminal, and a second fixing member which holds the second bar portion and is mounted on the case member to regulate movement of the terminal in a direction in which the first bar portion extends into the case member.

20 Claims, 13 Drawing Sheets

CIRCUIT BOARD CASE WITH ELECTRIC CONNECTOR AND ELECTRONIC UNIT PROVIDED WITH THE SAME

This application is the U.S. National Phase under 35. U.S.C. §371 of International Application PCT/JP2009/000131, filed Jan. 15, 2009, which claims priority to Japanese Patent Application No. 2008-014078, filed Jan. 24, 2008 and Japanese Patent Application No. 2008-115427, filed Apr. 25, 2008. The International Application was published under PCT Article 21(2) in a language other than English.

TECHNICAL FIELD

The present invention relates to a circuit board case with an electrical connector and an electronic unit provided with it.

BACKGROUND ART

Various electronic units 100, such as an ECU (electronic control unit) of a type shown in FIG. 21, have conventionally been used as connectors provided in automobiles and the like (PATENT DOCUMENT 1).

As shown in FIG. 21, the electronic unit 100 includes a case 101, a wiring board 102 provided in the case 101, and a connector 103 mounted on the case 101. The connector 103 includes a housing 104 mounted on the case 101, and a plurality of terminals 105 provided in the housing 104. The housing 104 is configured as an element separate from the case 101. Electronic components 106 are formed on the wiring board 102. The electronic components 106 are electrically connected through the terminals 105 to their counterpart terminals. An electrical connector as a counterpart of the connector 103 is mated with the connector 103, so that the electronic unit 100 is electrically connected through the counterpart electrical connector to a wire harness provided in an automobile or the like.

As another type, for example, as shown in FIG. 22, an electronic unit 110 in which the housing 104 of the connector 103 and the case 101 are integrally molded is disclosed (PATENT DOCUMENT 2).
Citation List
Patent Document
PATENT DOCUMENT 1: Japanese Patent Publication No. 2000-92652
PATENT DOCUMENT 2: Japanese Patent Publication No. H 11-284386

SUMMARY OF THE INVENTION

Technical Problem

However, in the electronic unit 100 as shown in FIG. 21, the case 101 and the housing 104 of the connector 103 are separate elements, and therefore it is difficult to stably fix the case 101 and the connector 103. Accordingly, a stress is easily generated in a joint between the wiring board 102 and the terminal 105, which makes it difficult to ensure connection reliability. Moreover, intrusion of a liquid, such as water, between the case 101 and the connector 103 might cause a problem with the quality of the electronic unit 100.

In the electronic unit 110 as illustrated in FIG. 22, the housing 104 of the connector 103 and the case 101 are integrally molded, and therefore, after insert molding of the terminals 105, the other ends thereof need to be bent. Accordingly, problems arise in the manufacturing efficiency and quality of the electronic unit 110. When an electronic unit including a multi-pin connector is manufactured with a large case, it is difficult to secure accuracy of a pitch dimension between terminals by such integral molding because of its molding shrinkage.

On the other hand, to solve the foregoing problems, an electronic unit is being studied and developed in which a connector mating portion to be mated with a counterpart electrical connector is formed integrally with a case member, and only a portion which fixes a terminal (terminal fixing member) is separately formed.

However, when the terminal fixing member is fit into the connector mating portion formed integrally with the case member, it is difficult to securely fit the terminal fixing member at the proper position in the connector mating portion, and the work requires skill. Further, there is a problem in that, after the operation of fixing the terminal fixing member into the connector mating portion, time is required for work of checking whether the terminal fixing member is securely fit at the proper position.

The present invention has been made in view of such respects, and the primary object of the invention is to provide a circuit board case with an electrical connector which is excellent in manufacturing efficiency and quality, and an electronic unit including it.

Another object of the invention is to provide a circuit board case with an electrical connector which enables a terminal fixing member to be securely fit into a connector mating portion in a simple way and the checking work to be simple and accurate, and an electronic unit including it.

Solution to the Problem

A circuit board case with an electrical connector according to the invention comprises a case member having formed thereon a connector mating portion to be mated with a counterpart electrical connector, a circuit board being accommodated in the case member and having an electronic component mounted thereon, a lid member mounted on the case member, and a connection member accommodated in the case member and mounted on the connector mating portion to electrically connect the counterpart connector and the circuit board. The connection member includes a terminal which comprises a first bar portion electrically connected with a terminal of the counterpart connector and a second bar portion formed integrally with the first bar portion and extending toward the lid member, a first fixing member which holds the first bar portion of the terminal and is mounted on the connector mating portion of the case member to fix the terminal, and a second fixing member which has an insertion hole formed therein and which holds the second bar portion by inserting the second bar portion into the insertion hole and is mounted on the case member to regulate movement of the terminal in a direction in which the first bar portion extends into the case member.

With this configuration, the connector mating portion to be mated with a counterpart electrical connector is formed integrally with the case member, and only a portion which fixes the terminal is formed as a separate element, and therefore variations in pitch dimension between terminals due to molding shrinkage can be excellently suppressed. When the first bar portion and the second bar portion are formed by bending the terminal, the formation can be performed outside of the case member 11 of the circuit board case with the electrical connector. This results in excellent accuracy of terminal dimensions and excellent manufacturing efficiency. Further, the second fixing member holds the second bar portions of the terminal by inserting them into the insertion holes, and is mounted on the case member to regulate movement of the terminal in the direction in which the first bar portion extends into the case member. It is therefore possible to excellently suppress removal of the terminal and the first fixing member from the connector mating portion. This leads to excellent reliability and the like of the quality of the circuit board case with the electrical connector.

In the circuit board case with the electrical connector according to the invention, the second fixing member may be provided with a locking portion and the case member may be provided with an engaging portion, the engaging portion of the case member being engaged with the locking portion of the second fixing member, so that movement of the terminal in the direction in which the first bar portion extends into the case member is regulated.

With this configuration, the engaging portion of the case member is engaged with the locking portion of the second fixing member, so that movement of the terminal in the direction in which the first bar portion extends into the case member is regulated. Therefore, removal of the terminal and the first fixing member from the connector mating portion can be suppressed with a simple structure. This leads to excellent manufacturing efficiency.

Further, in the circuit board case with the electrical connector according to the invention, the second fixing member may include a plate portion provided with the insertion hole passing therethrough in the thickness direction, the plate portion being formed to extend in a direction crossing the direction in which the first bar portion extends into the case member, and the locking portion of the second fixing member may be provided in at least one end in the longitudinal direction of the plate portion.

With this configuration, the locking portion of the second fixing member is provided in at least one end in the longitudinal direction of the plate portion. Therefore, removal of the terminal and the first fixing member from the connector mating portion can be suppressed with a simpler structure. This leads to more excellent manufacturing efficiency.

In the circuit board case with the electrical connector according to the invention, a plurality of second bar portions of the terminal and a plurality of insertion holes of the plate portion may be provided, and just one of the plurality of second bar portions may be inserted into each of the insertion holes of the plate portion.

With this configuration, just one of the plurality of second bar portions is inserted into each of the insertion holes of the plate portion. This enables the second bar portions to be aligned so that edge portions of the second bar portions are excellently inserted into terminal insertion holes provided in the circuit board.

Further, in the circuit board case with the electrical connector according to the invention, a plurality of second bar portions of the terminal may be provided, the insertion hole of the plate portion may be formed such that a plurality of elongated holes formed to extend in the width direction of the plate portion are arranged in the length direction of the plate portion, and a given number of ones of the second bar portions may be inserted into each of the elongated holes of the plate portion.

With this configuration, the insertion hole of the plate portion is formed such that a plurality of elongated holes formed to extend in the width direction of the plate portion are arranged in the length direction of the plate portion, and a given number of ones of the second bar portions are inserted into each of the elongated holes of the plate portion. The second bar portions can therefore be aligned so that edge portions of the second bar portions are excellently inserted into terminal insertion holes provided in the circuit board.

In the circuit board case with the electrical connector according to the invention, a plurality of second bar portions of the terminal may be provided, the insertion hole of the plate portion may be formed such that a plurality of elongated holes formed to extend in the length direction of the plate portion are arranged in the width direction of the plate portion, and a given number of ones of the second bar portions may be inserted into each of the elongated holes of the plate portion.

With this configuration, the insertion hole of the plate portion is formed such that a plurality of elongated holes formed to extend in the length direction of the plate portion are arranged in the width direction of the plate portion, and a given number of ones of the second bar portions are inserted into each of the elongated holes of the plate portion. The second bar portions can therefore be aligned so that edge portions of the second bar portions are excellently inserted into terminal insertion holes provided in the circuit board.

Further, in the circuit board case with the electrical connector according to the invention, the second fixing member may include a wall portion formed to extend from a surface of the plate portion into the case member, the wall portion being provided to abut on a surface inside of the case member of the first fixing member.

With this configuration, the second fixing member comprises a wall portion formed to extend from a surface of the plate portion into the case member, the wall portion being provided to abut on a surface inside of the case member of the first fixing member. The wall portion is therefore an obstacle to movement of the terminal and the first fixing member from the connector mating portion. Accordingly, removal of the terminal and the first fixing member from the connector mating portion can be suppressed more excellently.

In the circuit board case with the electrical connector according to the invention, the first fixing member may include an accommodation portion accommodated in the connector mating portion of the case member, and a forward stop portion formed in a step shape in an end of the accommodation portion, the forward stop portion abutting on the connector mating portion to regulate movement of the first fixing member toward the connector mating portion.

With this configuration, the first fixing member comprises an accommodation portion accommodated in the connector mating portion of the case member, and a forward stop portion formed in a step shape in an end of the accommodation portion, the forward stop portion abutting on the connector mating portion to regulate movement of the first fixing member toward the connector mating portion. Intrusion of the first fixing member, beyond a desired position, into the connector mating portion can therefore be excellently suppressed.

Further, in the circuit board case with the electrical connector according to the invention, the first fixing member may include a locking portion for locking to an interior wall of the connector mating portion of the case member.

With this configuration, the first fixing member comprises a locking portion for locking to an interior wall of the connector mating portion of the case member. The first fixing member can therefore be mounted on the connector mating portion more strongly. Intrusion of the first fixing member, beyond a desired position, into the connector mating portion can be excellently suppressed.

In the circuit board case with the electrical connector according to the invention, a projecting portion is formed in an end of the first fixing member, and the connector mating portion includes a peripheral wall standing up in the depth direction of the case member, the peripheral wall having a projecting portion insertion hole to which the projecting portion of the first fixing member is inserted and a projecting portion engaging hole to which the projecting portion inserted into the projecting portion insertion hole is fed with a movement path within the peripheral wall changed.

With this configuration, at the time of fitting and fixing the first fixing member to the connector mating portion, first, a projecting portion of the first fixing member is inserted into a projecting portion insertion hole formed in the peripheral wall of the connector mating portion. Then, the projecting portion of the first fixing member inserted into the projecting portion insertion hole is fed to a projecting portion engaging hole, with the movement path changed within the peripheral wall. Therefore, the movement path is changed after the projecting portion of the first fixing member has been inserted within the peripheral wall, which effectively suppresses return of the projecting portion to the insertion direction. Accordingly, detachment of the first fixing member from the connector mating portion can be excellently suppressed, and the connector mating portion of the first fixing member can be fit into the mounting hole with good accuracy by simple work. Further, when the projecting portion of the first fixing member inserted into the projecting portion insertion hole has been fed to the projecting portion engaging hole with the movement path changed within the peripheral wall, space which has not existed upon insertion is created between the first fixing member and the mounting hole of the peripheral wall. Specifically, in cases where the projecting portion of the first fixing member is fed to the projecting portion engaging hole with the movement path changed to be toward the bottom of the case member within the peripheral wall, the space which has not existed upon insertion is created above the first fixing member. Therefore, in order to check if the first fixing member is fit at its proper position of the connector mating portion, only examining the existence of the space is required. The checking can be readily performed without using a sensor, and without the need for skill and the like.

In the circuit board case with the electrical connector according to the invention, the projecting portion engaging hole of the peripheral wall may be provided at a position to which the projecting portion of the first fixing member inserted into the projecting portion insertion hole of the peripheral wall is fed with the movement path within the peripheral wall changed to be toward the bottom of the case member.

With this configuration, the projecting portion of the first fixing member is fed with the movement path within the peripheral wall changed to be toward the bottom of the case member. This makes the work easier than feeding the projecting portion toward another place, and makes it possible to stably install the first fixing member within the case member.

Further, in the circuit board case with the electrical connector according to the invention, the first fixing member may include an accommodation portion accommodated within the connector mating portion of the case member, and a forward stop portion formed in a step shape in an end of the accommodation portion, the forward stop portion abutting on the connector mating portion to regulate movement of the first fixing member toward the connector mating portion.

With this configuration, the first fixing member comprises a forward stop portion which is formed in a step shape in an end of the accommodation portion accommodated within the connector mating portion of the case member, and abuts on the connector mating portion to regulate movement of the first fixing member toward the connector mating portion. Therefore, intrusion of the first fixing member, beyond a desired position, into the connector mating portion can be excellently suppressed.

In the circuit board case with the electrical connector according to the invention, an inserting member may be inserted into a gap between the peripheral wall of the connector mating portion and the first fixing member fed to the projecting portion engaging hole of the peripheral wall such that the projecting portion is locked.

With this configuration, an inserting member is inserted into a gap between the peripheral wall of the connector mating portion and the first fixing member fed to the projecting portion engaging hole of the peripheral wall such that the projecting portion is locked. The first fixing member fit into the connector mating portion can therefore be fixed more strongly.

Further, in the circuit board case with the electrical connector according to the invention, on either one of an abutment surface on the inserting member of the first fixing member and an abutment surface on the first fixing member of the inserting member, a locking portion for locking the either one to another of the abutment surfaces may be formed.

With this configuration, on either one of an abutment surface on the inserting member of the first fixing member and an abutment surface on the first fixing member of the inserting member, a locking portion for locking the either one to another of the abutment surfaces is formed. Therefore, detachment of the inserting member from between the first fixing member and the connector mating portion can be excellently suppressed. Accordingly, it is possible to securely insert the inserting member between the first fixing member and the connector mating portion to more excellently suppress detachment of the first fixing member.

In the circuit board case with the electrical connector according to the invention, the inserting member may be formed of an elastic material.

With this configuration, the inserting member is formed of an elastic material. This results in excellent air tightness between the first fixing member and the peripheral wall of the connector mating portion, which leads to excellent performance of the connector. The inserting member can be freely inserted between the first fixing member and the peripheral wall of the connector mating portion, which leads to excellent workability.

Further, in the circuit board case with the electrical connector according to the invention, a locking portion may be formed in an end toward the inside of the case member of the inserting member, and an engaging portion which engages and fixes the locking portion of the inserting member may be formed in an end toward the outside of the case member of the second fixing member.

With this configuration, a locking portion of the inserting member inserted between the first fixing member and the connector mating portion is engaged with an engaging portion of the case member of the second fixing member. This enables the first fixing member, the inserting member and the second fixing member to be integrated, so that they are fixed more excellently.

In the circuit board case with the electrical connector according to the invention, the second fixing member may be provided with a locking portion and the case member may be provided with an engaging portion, the engaging portion of the case member being engaged with the locking portion of the second fixing member, so that movement of the terminal in the direction in which the first bar portion extends into the case member is regulated.

With this configuration, the engaging portion of the case member is engaged with the locking portion of the second fixing member, so that movement of the terminal in the direction in which the first bar portion extends into the case member is regulated. Therefore, removal of the terminal and the first fixing member from the connector mating portion can be suppressed with a simple structure. This leads to excellent manufacturing efficiency.

Further, in the circuit board case with the electrical connector according to the invention, the second fixing member may include a plate portion provided with the insertion hole passing therethrough in the thickness direction, the plate portion being formed to extend in a direction crossing the direction in which the first bar portion extends into the case member, and the locking portion of the second fixing member may be provided in at least one end in the longitudinal direction of the plate portion.

With this configuration, the locking portion of the second fixing member is provided in at least one end in the longitudinal direction of a plate portion formed to extend in a direction crossing the direction in which the first bar portion extends into the case member. Therefore, removal of the terminal and the first fixing member from the connector mating portion can be suppressed with a simpler structure. This leads to more excellent manufacturing efficiency.

In the circuit board case with the electrical connector according to the invention, the second fixing member may comprise a wall portion formed to extend from a surface of the plate portion into the case member, the wall portion being provided to abut on a surface inside of the case member of the first fixing member.

With this configuration, the second fixing member comprises a wall portion which is formed to extend from a surface of the plate portion into the case member, and which is provided to abut on a surface inside of the case member of the first fixing member. The wall portion is therefore an obstacle to movement of the terminal and the first fixing member from the connector mating portion. Accordingly, removal of the terminal and the first fixing member from the connector mating portion can be suppressed more excellently.

An electronic unit according to the invention comprises the above-described circuit board case with the electrical connector.

With this configuration, an electronic unit comprises the above-described circuit board case with the electrical connector, and therefore its manufacturing efficiency and quality are excellent. Detachment of the first fixing member from the connector mating portion can be excellently suppressed, and the first fixing member can be fit into the connector mating portion with good accuracy by simple work. Further, in order to check if the first fixing member is fit at its proper position of the connector mating portion, only examining the existence of the space is required. The checking can be performed without using a sensor, and without the need for skill and the like.

Advantages of the Invention

According to the invention, it is possible to provide a circuit board case with an electrical connector which is excellent in manufacturing efficiency and quality, and an electronic unit comprising it.

It is also possible to provide a circuit board case with an electrical connector which enables a terminal fixing member to be securely fit into a connector mating portion in a simple way and the checking work to be simple and accurate, and an electronic unit comprising it.

DESCRIPTION OF EMBODIMENTS

A circuit board case with an electrical connector and an electronic unit provided with it according to embodiments of the invention will be described in detail below. It should be noted that the invention is not limited to the following embodiments.

<First Embodiment>

(Configuration of Circuit Board Case 10 with Electrical Connector)

Figure 1:
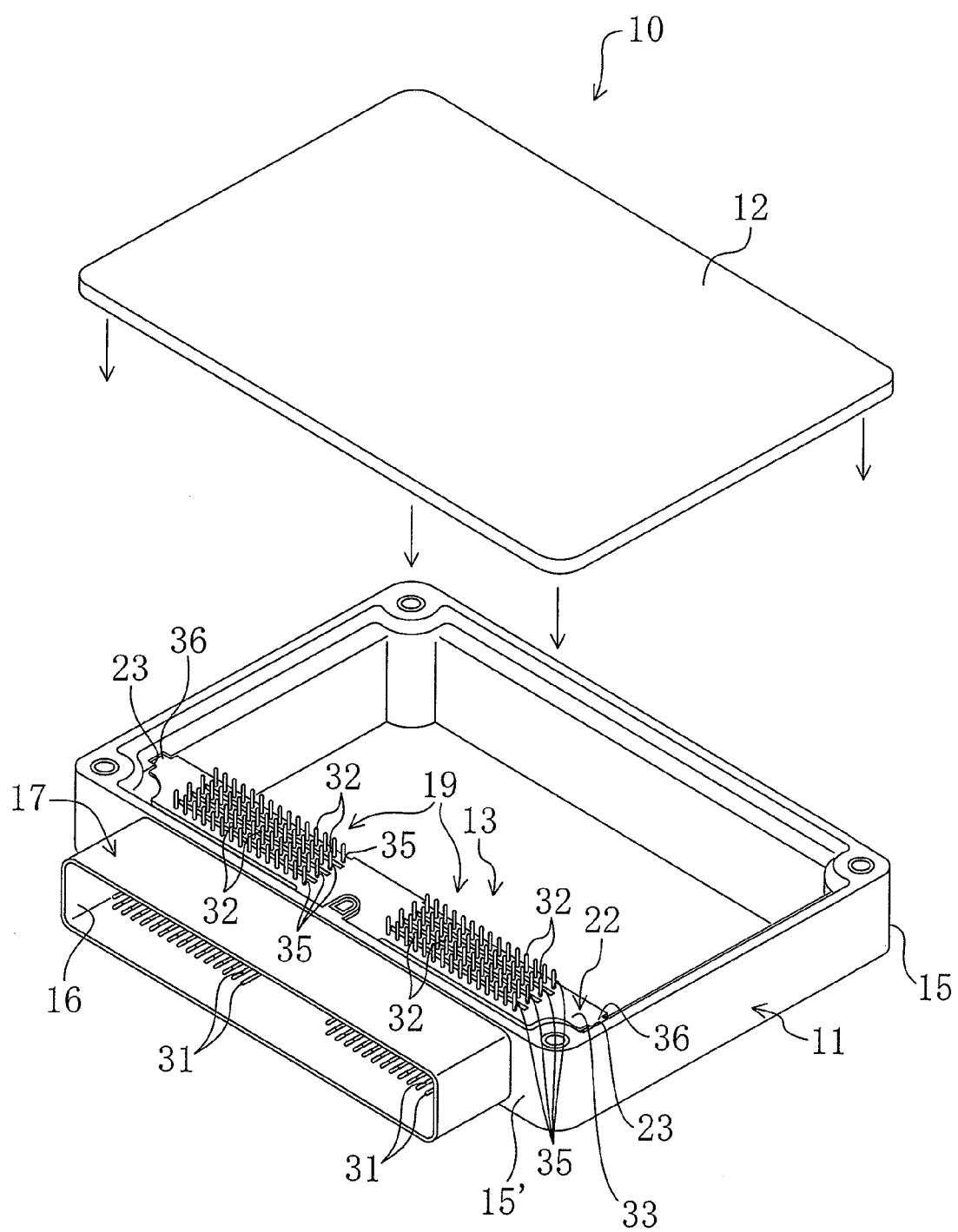
FIG. 1 is a schematic view of a circuit board case with an electrical connector, in a state in which a lid member is removed, according to a first embodiment of the invention.
Figure 2:
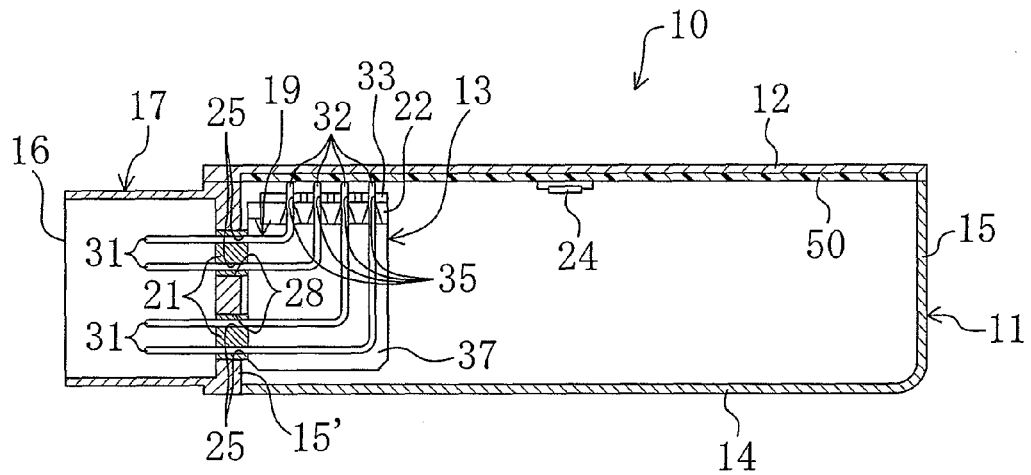
FIG. 2 is a sectional view of the circuit board case with the electrical connector.

FIG. 1 is a schematic view of a circuit board case 10 with an electrical connector, in a state in which a lid member 12 is removed, according to the first embodiment of the invention. FIG. 2 is a sectional view of the circuit board case 10 with the electrical connector. The circuit board case 10 with the electrical connector comprises a case member 11, a lid member 12, a circuit board 50 and a connection member 13.

The case member 11 includes a rectangular bottom plate 14, and a plurality of peripheral walls 15 and 15' which are formed integrally therewith to stand up from the bottom plate 14. Formed on one peripheral wall 15' of the case member 11 is a connector mating portion 17 which projects outside of the case member 11 and has an opening 16 and which is to be mated with a circuit board case with a counterpart electrical connector. In the connector mating portion 17, formed along the circumferential direction of the corresponding peripheral wall 15' are press-fit holes 28 into which first fixing members 21 of the connection member 13 to be described later are to be fit. Two press-fit holes 28 are arranged in parallel in each of the width direction and the length direction of the corresponding peripheral wall 15', and therefore four holes in total are formed.

In each of the peripheral walls 15 adjacent to the peripheral wall 15' on which the connector mating portion 17 is formed, the grooved engaging portion 23 is formed at its upper end. The grooved engaging portions 23 are formed in the vicinities of the peripheral wall 15' having the connector mating portion 17 formed thereon in the peripheral walls 15 in which the engaging portions 23 are formed.

The lid member 12 is formed in the shape of a rectangular thin plate. The lid member 12 is mounted on the case member 11 with packing (not shown) made of rubber for suppressing intrusion of water interposed therebetween. The lid member 12 may be mounted on the case member 11 using not only packing made of rubber but also a known sealing material. The lid member 12 and the case member 11 are each formed of an insulating synthetic resin or the like.

The circuit board 50 comprises an insulating substrate, and an electronic component 24 provided on the insulating substrate. A conductive pattern of copper foil or the like electrically connected to the electronic component 24 is made on the circuit board 50.

Figure 3:
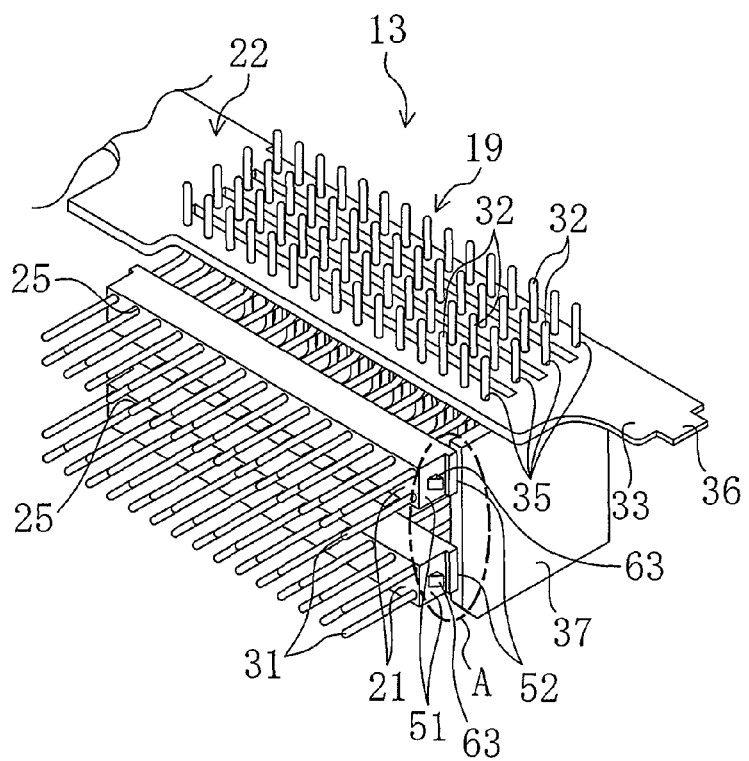
FIG. 3 is a perspective view in which part of a connection member is enlarged.

The connection member 13, as shown in FIGS. 1-3, is accommodated in the case member 11 and mounted on the connector mating portion 17. The connection member 13 comprises the first fixing members 21, terminals 19 and a second fixing member 22.

The first fixing member 21 comprises an accommodation portion 51 which is formed in the shape of an elongated plate and is accommodated within the connector mating portion 17 of the case member 11. In the accommodation portion 51 of the first fixing member 21, rows of a plurality of insertion holes 25 at approximately regular intervals are formed vertically in parallel along a direction in which the plate extends. The first bar portions 31 of the terminal 19 are inserted into the corresponding plurality of insertion holes 25 of the first fixing member 21 to hold the terminal 19. The first fixing member 21 is formed of, for example, a resin or the like. Four first fixing members 21 in total are provided, and are mounted by press-fitting them into the corresponding four press-fit holes 28 formed vertically and horizontally in parallel in the connector mating portion 17, so that the terminals 19 are fixed. The projecting locking portion 63 for locking to the interior wall of the connector mating portion 17 of the case member is formed on a side surface of the accommodation portion 51. The locking portion 63 may be formed at any position where it makes contact with the interior wall of the connector mating portion 17, and the number of positions is not limited. Formed in an end of the accommodation portion 51 is a forward stop portion 52 which is formed in a step shape to abut on the connector mating portion 17 so as to regulate movement of the first fixing member 21 toward the connector mating portion 17.

Note that the first fixing member 21 may not be configured as an element separate from the terminal 19 such that the terminal 19 is mounted by inserting the first bar portions 31 as mentioned above. That is, for example, the terminal 19 may be arranged inside of a die, or the like, and injection molding using a resin material or the like may be performed to manufacture the first fixing member 21 integrated with the terminal 19.

The terminal 19 is formed of a conductive member, and comprises the first bar portions 31 which are electrically connected with a terminal of the counterpart connector, and the second bar portions 32 which are formed integrally with the first bar portions 31 and extend toward the lid member 12. The individual first and second bar portions 31 and 32 are formed by bending one terminal bar by approximately 90°.

The first bar portions 31 are inserted into the insertion holes 25 of the first fixing member 21 and project to the opposite side thereof by the same length. The first bar portions 31 corresponding to the lower insertion holes 25 of the first fixing member 21 are formed longer in the direction of the inside of the case member 11 of the first fixing member 21 than the first bar portions 31 corresponding to the upper insertion holes 25. The first fixing members 21, as described above, each include two rows of insertion holes 25 into which the first bar portions 31 are to be inserted, and are press-fit into the four press-fit hole 28 formed in the connector mating portion 17 of the case member 11. In this manner, eight rows, in total, including a plurality of first bar portions 31 are provided.

The second bar portion 32 is configured to extend toward the lid member 12 by approximately 90° from an end toward the inside of the case member 11 of the first bar portion 31. The second bar portions 32 extend from the corresponding plurality of first bar portions 31 to the lid member 12, and their edges are horizontally even. With the edges, the second bar portions 32 are electrically connected to the conductive pattern made on the circuit board 50.

The second fixing member 22 is made of, for example, a resin material, and comprises a plate portion 33 formed to extend in a direction crossing the direction in which the first bar portions 31 extend into the case member 11. That is, the plate portion 33 of the second fixing member 22 is provided to extend along the peripheral wall 15' on which the connector mating portion 17 of the case member 11 is formed.

In both ends in the length direction of the plate portion 33, projecting locking portions 36 are formed. In the plate portion 33, rows of a plurality of insertion holes 35 are formed in parallel to each other along the length direction of the plate such that the insertion holes 35 are at approximately regular intervals and pass through the plate portion 33 in the thickness direction. Four rows of insertion holes 35 are formed in the width direction of the plate portion 33, and two units of them are provided apart from each other in the length direction of the plate portion 33. Regarding the insertion hole 35, just one second bar portion 32 is inserted into one hole.

Figure 4:
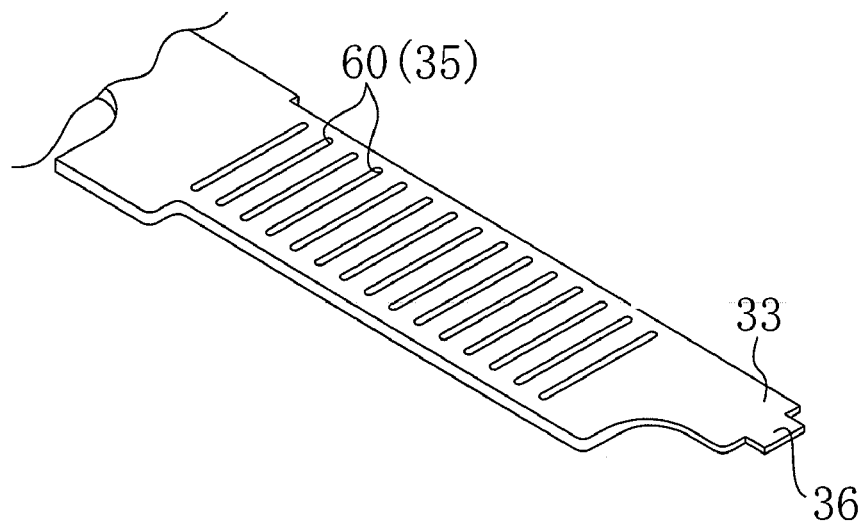
FIG. 4 is a plan view of a plate portion in which insertion holes are formed to extend in the width direction thereof.
Figure 5:
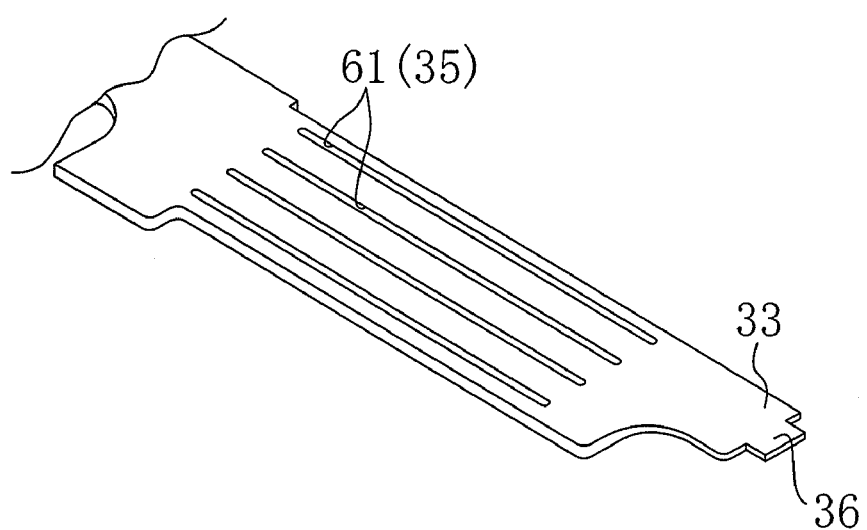
FIG. 5 is a plan view of a plate portion in which insertion holes are formed to extend in the length direction thereof.

Note that the insertion holes 35 of the plate portion 33 are not limited to those in the configuration mentioned above. For example, as shown in FIG. 4, a plurality of elongated holes 60, which are each formed to extend in the width direction of the plate portion 33, may be arranged in the length direction of the plate portion 33, and a group of second bar portions 32 in one row, which includes a given number of second bar portions 32, may be inserted into each elongated hole 60. Regarding the insertion holes 35, as shown in FIG. 5, a plurality of elongated holes 61, which are each formed to extend in the length direction of the plate portion 33, may be arranged in the width direction of the plate portion 33, and a group of second bar portions 32 in one row, which includes a given number of second bar portions 32, may be inserted into each elongated hole 61.

The second fixing member 22 is held by inserting the second bar portions 32, which are provided to extend from the corresponding plurality of first bar portions 31 to the lid member 12, into the insertion holes 35, which are formed in four rows in the width direction of the plate portion 33 and two units of which are provided apart from each other in the length direction. Eight rows of insertion holes 35 of the plate portion 33 are provided at positions corresponding to eight rows of second bar portions 32 to be inserted. Therefore, the second bar portions 32 can readily be inserted into the insertion holes 35 of the plate portion 33 by covering the insertion holes 35 with the second fixing member 22 from the above.

The second fixing member 22 is mounted on the case member 11 to regulate movement of the terminals 19 in the direction in which the first bar portions 31 extend into the case member 11. For the mounting on the case member 11, specifically, the grooved engaging portion 23 of the case member 11 is engaged with the projecting locking portion 36 of the plate portion 33. By this means, the second fixing member 22 regulates movement of the terminal 19 in the direction in which the first bar portions 31 extend into the case member 11.

Further, the second fixing member 22 comprises wall portions 37 which are formed integrally therewith to extend from the surface of the plate portion 33 into the case member 11 and are provided to abut on the surfaces inside of the case member 11 of the first fixing members 21. A frame A shown in FIG. 3 indicates a region where the wall portion 37 abuts on the first fixing members 21.

Four wall portions 37 are formed such that they sandwich a plurality of second bar portions 32, which are provided in four rows at each of two locations at regular intervals along the direction of extension of the peripheral wall 15' corresponding to the connector mating portion 17 of the case member 11, from both sides in the length direction of the plate portion 33.

The four wall portions 37 of the second fixing member 22 are provided such that the first fixing members 21 abut on the surfaces of the wall portions 37 on the side of the connector mating portion 17 of the case member 11. This suppresses removal of the terminals 19 and the first fixing members 21 from the connector mating portion 17.

Note that positions of the engaging portions 23 of the case member 11 and positions of the locking portions 36 of the second fixing member 22 are not limited. For example, the engaging portion 23 of the case member 11 may be a groove provided in the bottom plate 14 of the case member 11, and the locking portion 36 of the second fixing member 22 may be formed at a position corresponding to the groove at the edge of the wall portion 37.

An electronic unit according to the invention is configured such that the circuit board case 10 with the electrical connector having the above-described configuration is provided with a separate connection member, electronic components and the like, and also functions as one unit having a given electrical application.

(Method of Manufacturing Circuit Board Case 10 with Electric Connector)

Figure 6:
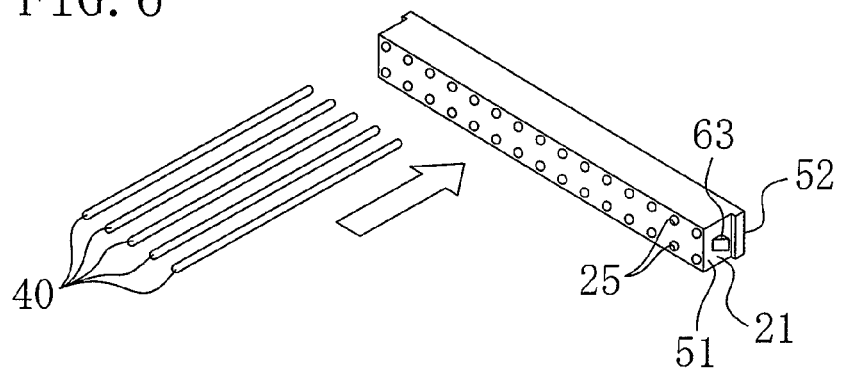
FIG. 6 is a schematic view showing a state in which bar terminals are being inserted into insertion holes of a first fixing member.
Figure 7:
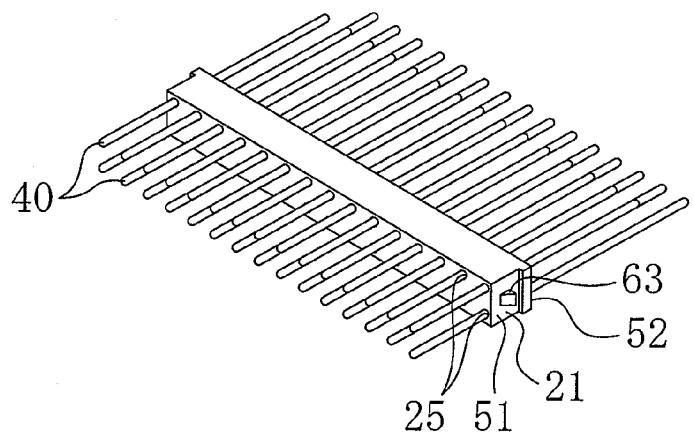
FIG. 7 is a schematic view of the first fixing member in which bar terminals are inserted into insertion holes.

Next, a description is given of a method of manufacturing the circuit board case 10 with the electrical connector having the above-described configuration. First, as shown in FIG. 6, a plurality of bar terminals 40, each of which is linear, and the first fixing member 21 are prepared. Then, the bar terminals 40 are inserted into the corresponding insertion holes 25 of the first fixing member 21. The length in which the bar terminals 40 are inserted into the first fixing members 21 may be arbitrarily set. However, since bending portions are required for the second bar portions 32 to be formed later, it is desirable that the bar terminals 40 be inserted until the first fixing member 21 is positioned closer to either of ends of the bar terminals 40, as shown in FIG. 7. At this point, the plurality of bar terminals 40 are inserted so that all the positions of their edges are aligned.

Figure 8:
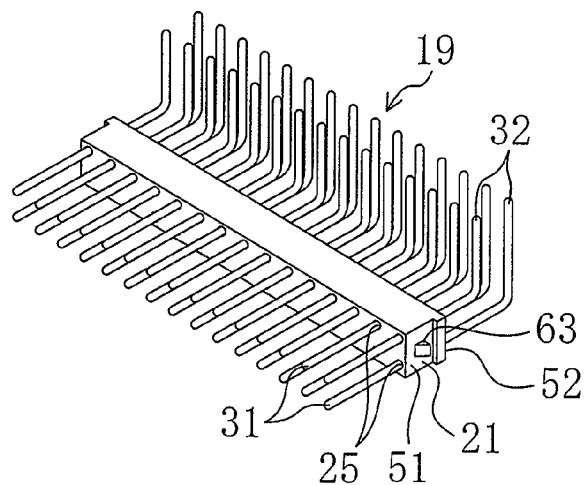
FIG. 8 is a schematic view of first and second bar portions formed by bending bar terminals, and the first fixing member.

Next, as shown in FIG. 8, longer portions of the bar terminals 40 extending on both sides of the first fixing member 21 are bent at given positions by approximately 90°. The directions of the bending of all the bar terminals 40 each intersect the length direction of the first fixing member 21 and are the same. The terminal 19 is thereby completed which includes the first bar portions 31 inserted into the first fixing members 21 and the second bar portions 32 being bent from the first bar portions 31 by approximately 90° and extending. Four terminals 19 fixed by the first fixing members 21 in this way are manufactured.

Figure 9:
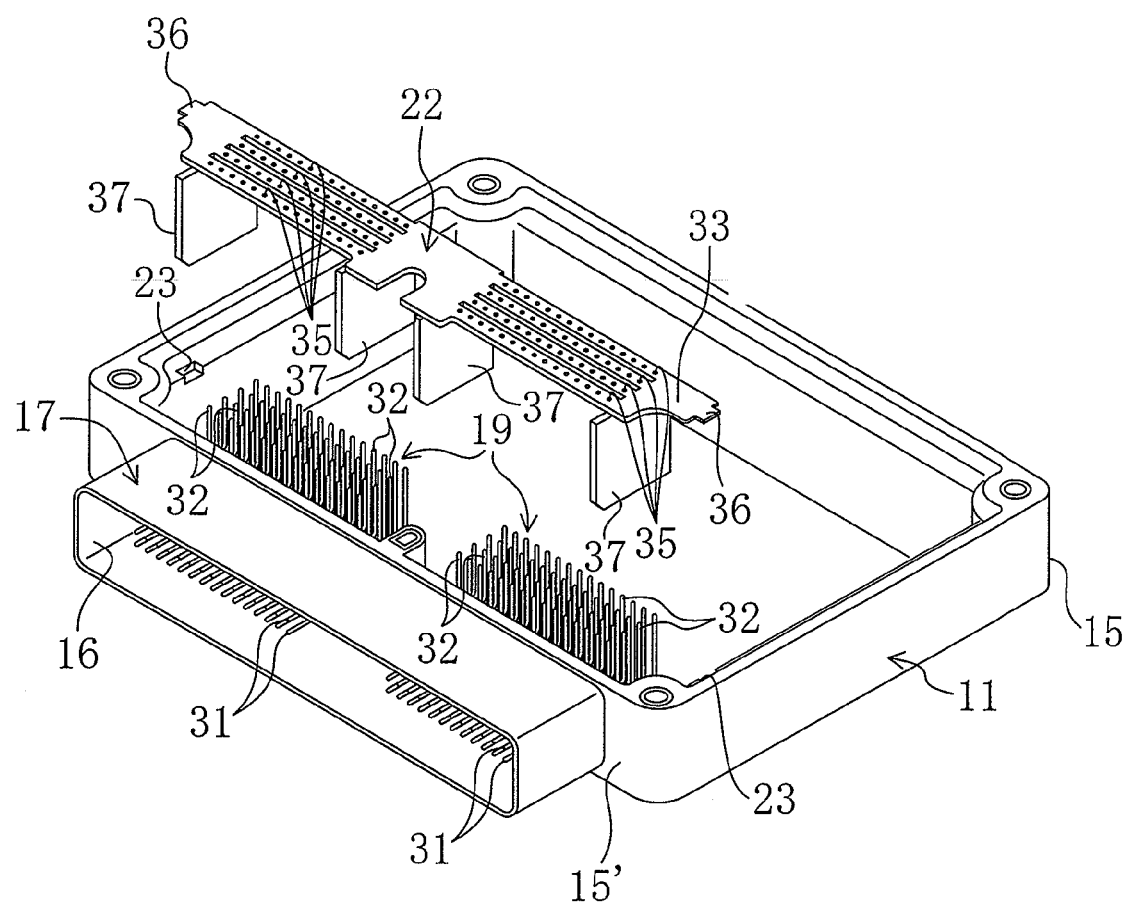
FIG. 9 is a schematic view showing a state in which second bar portions of a terminal are being inserted into insertion holes of a second fixing member.

Subsequently, as shown in FIG. 9, the case member 11 is prepared, and the terminals 19 fixed by the first fixing members 21 manufactured as described above are mounted on the case member 11. Specifically, the terminals 19 fixed by the first fixing members 21 are arranged in the case member 11 such that edges of the first bar portions 31 are toward the connector mating portion 17. At this point, the second bar portions 32 face to a direction in which the lid member 12 is to be mounted. Then, the terminals 19 fixed by the first fixing members 21 are caused to slide, just as they are, toward the connector mating portion 17 so that four first fixing members 21 are press-fit into the corresponding, four press-fit holes 28 of the connector mating portion 17. This causes the terminals 19 fixed by the first fixing members 21 to be fixed within the case member 11.

Figure 10:
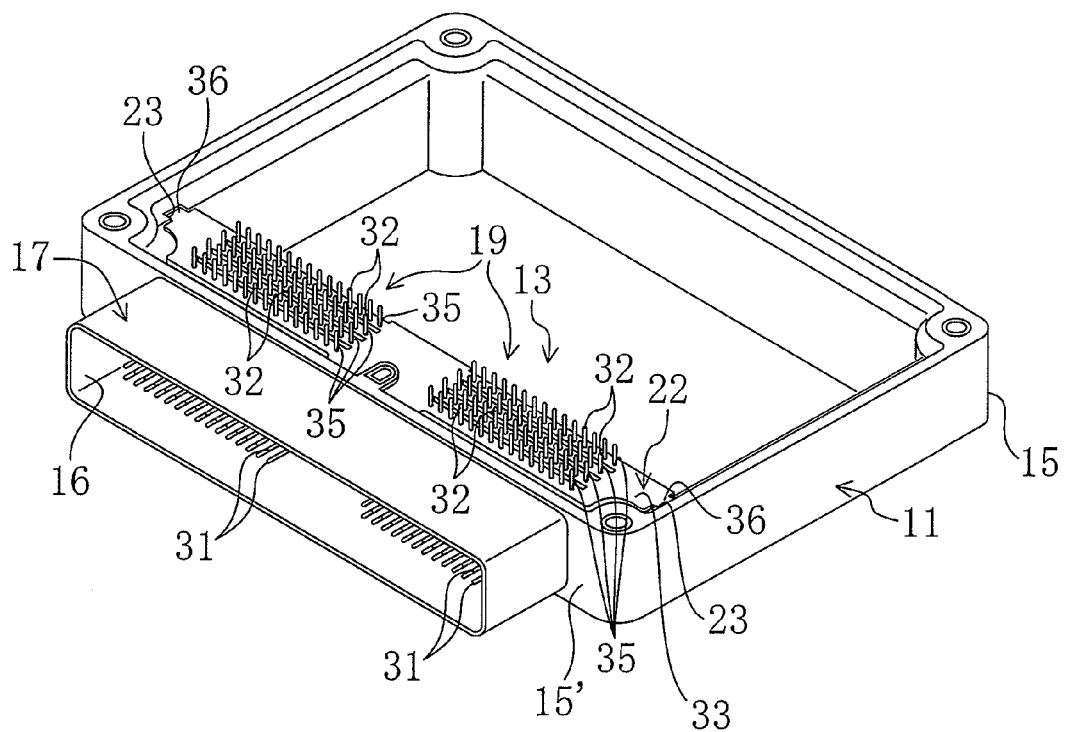
FIG. 10 is a perspective view of a case member and a connection member which has been mounted on the case member.

Next, as shown in FIG. 10, the second bar portions 32 of the terminals 19 fixed within the case member 11 are covered with the second fixing member 22 such that a plurality of second bar portions 32 are inserted into the corresponding insertion holes 35 of the plate portion 33 and are held with the edges of the second bar portions 32 projecting from the plate portion 33 by a given length. The second fixing member 22 holds a plurality of second bar portions 32 of the terminal 19, and also has a function to align the second bar portions 32 at their respective, given positions.

At this point, the grooved engaging portions 23 of the case member 11 are engaged with the projecting locking portions 36 formed on both ends in the length direction of the plate portion 33. The wall portions 37 of the second fixing member 22 are provided so as to sandwich, in the length direction of the plate, a plurality of second bar portions 32 provided in four rows at each of two locations at regular intervals along the direction of extension of the peripheral wall 15' corresponding to the connector mating portion 17 of the case member 11. The four wall portions 37 of the second fixing member 22 are provided such that the first fixing members 21 abut on the surfaces of the wall portions 37 on the side of the connector mating portion 17 of the case member 11. Thus, installation of the connection member 13 into the case member 11 is completed.

Subsequently, the circuit board 50 including the electronic component 24 and a conductive pattern (not shown) of copper foil or the like electrically connected to the electronic component 24, and the lid member 12 are prepared.

Here, a circuit pattern is formed on an insulating substrate and further the electronic component 24 is mounted on it, so that the circuit board 50 is formed. A circuit pattern may be formed by pattern printing using conductive ink on an insulating substrate. A circuit pattern may also be formed by patterning a conductive material by means of photolithography technology after an insulating substrate is covered with a conductive material. Further, a circuit pattern may be formed by attaching onto an insulating substrate a conductive material which has been previously punched into the circuit pattern.

Next, the circuit board 50 is mounted onto the lid member 12. Further, the electronic component 24 and the like of the circuit board 50 face the case member 11, and the circuit board 50 and the lid member 12 are mounted and fixed onto the case member 11 with packing made of rubber or the like interposed therebetween. Thus, the circuit board case 10 with the electrical connector is completed.

(Connector Connecting Method)

At the time of electrically connecting the circuit board case 10 with the electrical connector according to the first embodiment to the counterpart electrical connector, the connecting terminal of the counterpart electrical connector is opposed to the connector mating portion 17 of the case member 11. Then, the counterpart electrical connector is inserted into the connector mating portion 17 to be mated with it, so that the connecting terminal of the counterpart electrical connector is electrically connected with the first bar portions 31 of the terminal 19 of the circuit board case 10 with the electrical connector according to the first embodiment. This establishes electrical connection of a wire harness of an automobile or the like connected to the counterpart electrical connector and the electronic component 24 mounted on the circuit board 50 of the circuit board case 10 with the electrical connector.

Here, when the counterpart electrical connector is being inserted into the connector mating portion 17 of the case member 11, a force in the direction of pushing the terminals 19 into the case member 11 is applied to the terminals 19. However, the wall portion 37 of the second fixing member 22 which fixes the second bar portions 32 of the terminal 19 abuts on the forward stop portions 52 of the first fixing member 21 which fixes the first bar portions 31 (A of FIG. 3). Regarding the second fixing member 22 including the wall portions 37, the engaging portions 23 of the case member 11 are engaged with the locking portions 36 of the plate portions 33. Movement of the first fixing member 21 fixing the terminal 19, which has received the force in the direction of pushing the terminals 19 into the case member 11, toward the direction is suppressed by the wall portions 37 of the second fixing members 22 fixed in the case member 11. Accordingly, it is possible to excellently suppress removal from the connector mating portion 17 and fall into the case member 11 of the terminals 19.

(Operational Advantage)

Next, the circuit board case 10 with the electrical connector according to the first embodiment of the invention is described. The circuit board case 10 with the electrical connector according to the first embodiment of the invention comprises the case member 11 having formed thereon the connector mating portion 17 to be mated with a counterpart electrical connector, the circuit board 50 being accommodated in the case member 11 and having the electronic component 24 mounted thereon, the lid member 12 mounted on the case member 11, and the connection member 13 accommodated in the case member 11 and mounted on the connector mating portion 17 to electrically connect the counterpart connector and the circuit board 50. The connection member 13 comprises the terminal 19 which comprises a first bar portion 31 electrically connected with a terminal of the counterpart connector, and a second bar portion 32 formed integrally with the first bar portion 31 and extending toward the lid member 12; the first fixing member 21 which holds the first bar portion 31 of the terminal 19 and is mounted on the connector mating portion 17 of the case member 11 to fix the terminal 19; and the second fixing member 22 which has the insertion hole 35 formed therein and which holds the second bar portion 32 by inserting the second bar portion 32 into the insertion hole 35, and is mounted on the case member 11 to regulate movement of the terminal 19 in a direction in which the first bar portion 31 extends into the case member 11.

With this configuration, the connector mating portion 17 to be mated with a counterpart electrical connector is formed integrally with the case member 11, and only a portion which fixes the terminal 19 is formed as a separate element, and therefore variations in pitch dimension between the terminals 19 due to molding shrinkage can be excellently suppressed. When the first bar portion 31 and the second bar portion 32 are formed by bending the terminal 19, the formation can be performed outside of the case member 11 of the circuit board case 10 with the electrical connector. This results in excellent accuracy of terminal dimensions and excellent manufacturing efficiency. Further, the second fixing member 22 holds the second bar portions 32 of the terminal 19 by inserting them into the insertion holes 35, and is mounted on the case member 11 to regulate movement of the terminal 19 in the direction in which the first bar portions 31 extend into the case member 11. It is therefore possible to excellently suppress removal of the terminal 19 and the first fixing members 21 from the connector mating portion 17. This leads to excellent reliability and the like of the quality of the circuit board case 10 with the electrical connector.

<Second Embodiment>

(Configuration of Circuit Board Case 10 with Electrical Connector)

Figure 11:
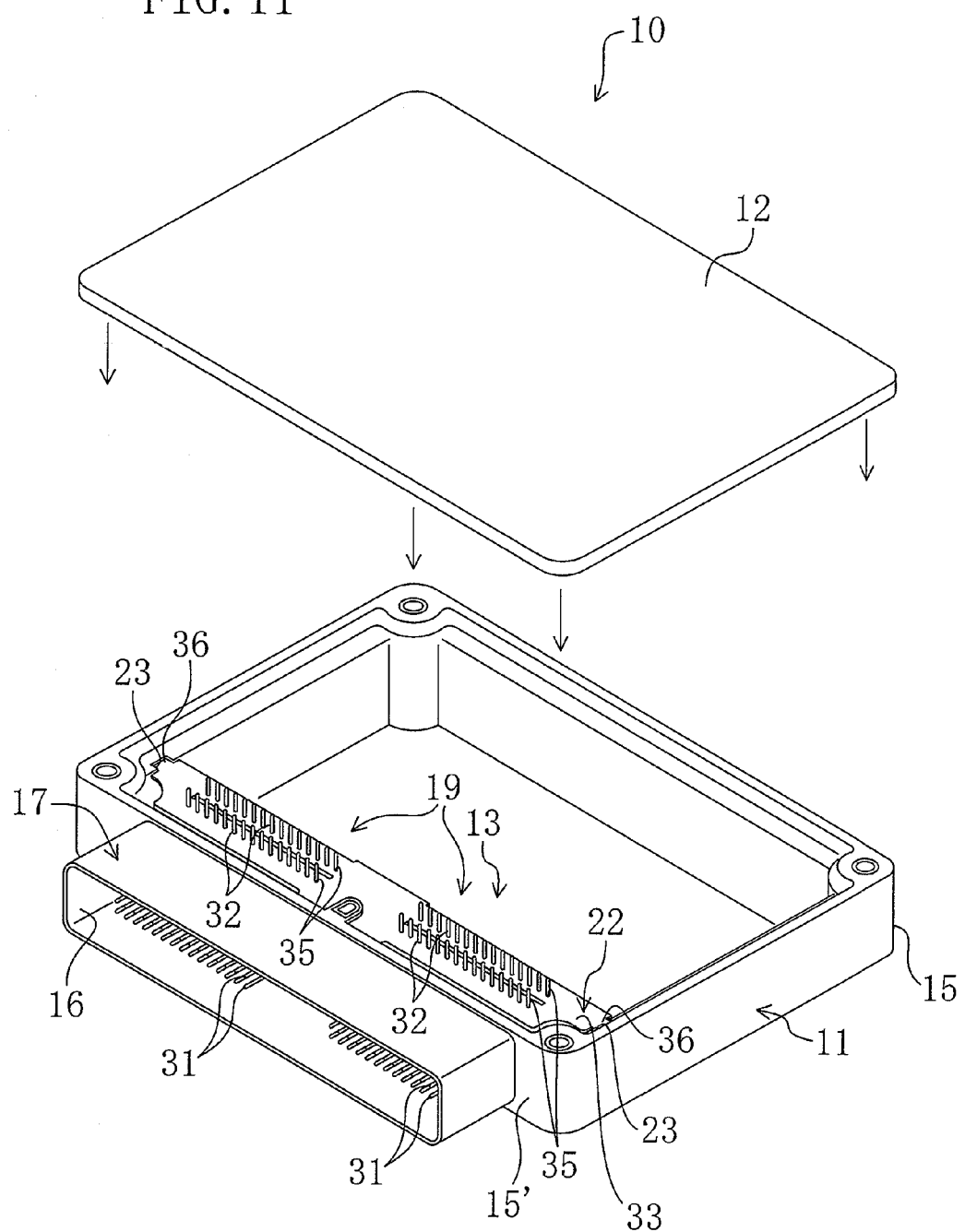
FIG. 11 is a schematic view of a circuit board case with an electrical connector, in a state in which a lid member is removed, according to a second embodiment of the invention.
Figure 12:
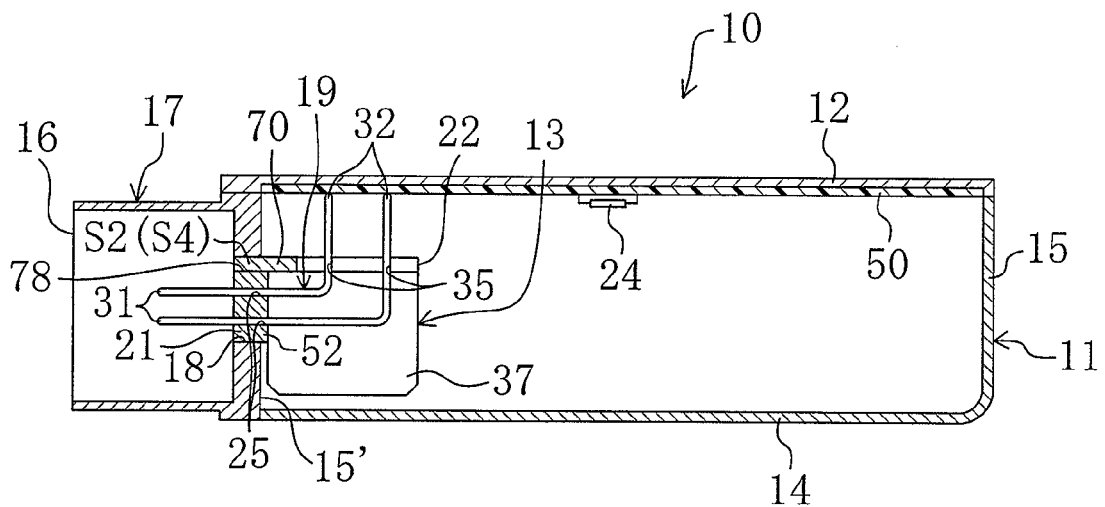
FIG. 12 is a sectional view of the circuit board case with the electrical connector.

FIG. 11 is a schematic view of the circuit board case 10 with the electrical connector, in a state where the lid member 12 is removed, according to a second embodiment of the invention. FIG. 12 is a sectional view of the circuit board case 10 with the electrical connector. The circuit board case 10 with the electrical connector comprises the case member 11, the lid member 12, the circuit board 50 and the connection member 13.

The case member 11 includes the rectangular bottom plate 14, and the plurality of peripheral walls 15 and 15' which are formed integrally with the bottom plate 14 to stand up therefrom. Formed on one peripheral wall 15' of the case member 11 is the connector mating portion 17 which projects outside of the case member 11 and has the opening 16 and which is mated with a circuit board case with a counterpart electrical connector. In the connector mating portion 17, formed along the circumferential direction of the corresponding peripheral wall 15' are mounting holes 18 on which the first fixing members 21 of the connection member 13 to be described later are to be mounted. Two mounting holes 18 are arranged in parallel in the length direction of the corresponding peripheral wall 15'.

In each of the peripheral walls 15 adjacent to the peripheral wall 15' included in the connector mating portion 17, the grooved engaging portion 23 is formed at its upper end. The grooved engaging portions 23 are formed in the vicinities of the peripheral wall 15' having the connector mating portion 17 formed thereon in the peripheral walls 15 in which the engaging portions 23 are formed.

The lid member 12 is formed in the shape of a rectangular thin plate. The lid member 12 is mounted on the case member 11 with packing (not shown) made of rubber for suppressing intrusion of water interposed therebetween. The lid member 12 may be mounted on the case member 11 using not only packing made of rubber but also a known sealing material. The lid member 12 and the case member 11 are each formed of an insulating synthetic resin or the like.

The circuit board 50 comprises an insulating substrate, and the electronic component 24 provided on the insulating substrate. A conductive pattern of copper foil or the like electrically connected to the electronic component 24 is made on the circuit board 50.

Figure 13:
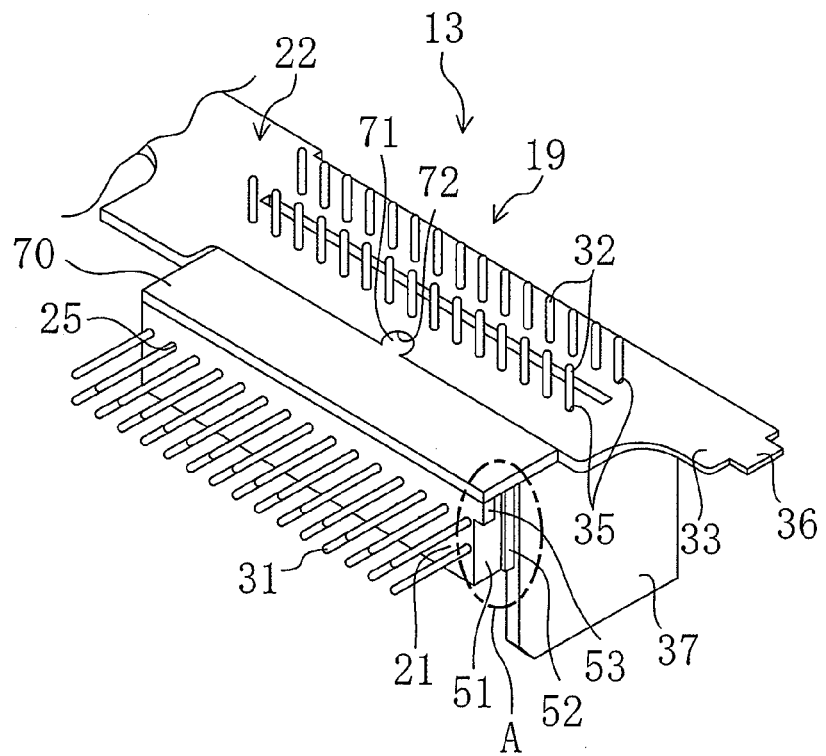
FIG. 13 is a perspective view of a connection member.

FIG. 13 is a perspective view of the connection member 13. The connection member 13, as shown in FIGS. 11-13, is accommodated in the case member 11 and mounted on the connector mating portion 17. The connection member 13 comprises the first fixing members 21, the terminals 19, the second fixing member 22 and inserting members 70.

Figure 14:
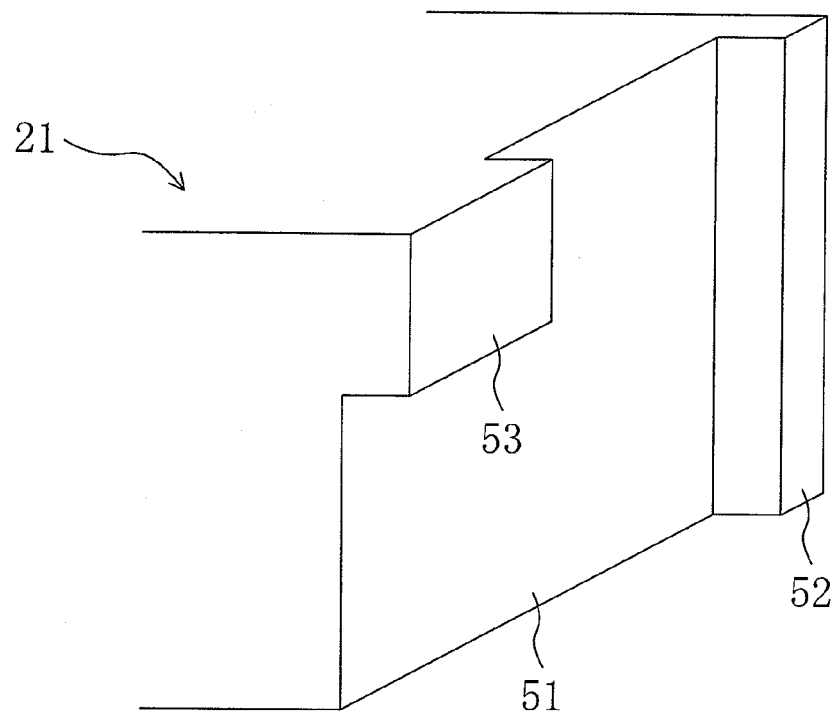
FIG. 14 is an enlarged view of an end of a first fixing member.

The first fixing member 21 comprises the accommodation portion 51 which is formed in an elongated plate shape and is accommodated within the connector mating portion 17 of the case member 11. In the accommodation portion 51 of the first fixing member 21, rows of a plurality of insertion holes 25 at approximately regular intervals are formed vertically in parallel along a direction in which the plate extends. The first bar portions 31 of the terminal 19 are inserted into the corresponding plurality of insertion holes 25 of the first fixing member 21 to hold the terminal 19. The first fixing member 21 is formed of, for example, a resin or the like. Two first fixing members 21 in total are provided, and are mounted by press-fitting them into the corresponding two mounting holes 18 formed horizontally in parallel in the connector mating portion 17, so that the terminals 19 are fixed. Formed in an end of the accommodation portion 51 is, as shown in FIG. 14, the forward stop portion 52 which is formed in a step shape to abut on the connector mating portion 17 to regulate movement of the first fixing member 21 toward the connector mating portion 17. A projecting portion 53 is formed in an end of the accommodation portion 51. The projecting portion 53 is formed in a prism shape and is formed in an end of the accommodation portion 51 forward and upward in a direction of insertion of the first fixing member 21. Note that the shape of the projecting portion 53 is not particularly limited, and may be cylindrical, pyramidal or conical. The formation position of the projecting portion 53 may be the surface of an end of the accommodation portion 51, and the projecting portion 53 may be formed, for example, backward or at the center in the direction of insertion of the first fixing member 21 in the end of the accommodation portion 51.

Note that the first fixing member 21 may not be configured as an element separate from the terminal 19 such that the terminal 19 is mounted by inserting the first bar portions 31 as mentioned above. That is, for example, the terminals 19 may be arranged inside of a die, or the like, and injection molding using a resin material or the like may be performed to manufacture the first fixing members 21 integrated with the terminals 19.

The terminal 19 is formed of a conductive member, and comprises the first bar portions 31 which are electrically connected with a terminal of a counterpart connector, and the second bar portions 32 which are formed integrally with the first bar portions 31 and extend toward the lid member 12. The individual first and second bar portions 31 and 32 are formed by bending one terminal bar by approximately 90°.

The first bar portions 31 are inserted into the insertion holes 25 of the first fixing member 21 and project to the opposite side thereof by the same length. The first bar portions 31 corresponding to the lower insertion holes 25 of the first fixing member 21 are formed longer in the direction of the inside of the case member 11 of the first fixing member 21 than the first bar portions 31 corresponding to the upper insertion holes 25. The first fixing members 21 each include two rows of insertion holes 25 into which the first bar portions 31 are to be inserted, and are press-fit into the four mounting holes 18 formed in the connector mating portion 17 of the case member 11. In this manner, four rows, in total, including a plurality of first bar portions 31 are provided.

The second bar portion 32 is configured to extend toward the lid member 12 by approximately 90° from an end close to the inside of the case member 11 of the first bar portion 31. The second bar portions 32 extend from the corresponding plurality of first bar portions 31 to the lid member 12, and their edges are horizontally even. With the edges, the second bar portions 32 are electrically connected to the conductive pattern made on the circuit board 50.

The second fixing member 22 is made of, for example, a resin material, and comprises the plate portion 33 formed to extend in a direction crossing the direction in which the first bar portions 31 extend into the case member 11. That is, the plate portion 33 of the second fixing member 22 is provided to extend along the peripheral wall 15' on which the connector mating portion 17 of the case member 11 is formed.

In both ends in the length direction of the plate portion 33, projecting locking portions 36 are formed. In the plate portion 33, rows of a plurality of insertion holes 35 are formed in parallel to each other along the length direction of the plate such that the insertion holes 35 are at approximately regular intervals and pass through the plate portion 33 in the thickness direction. Two rows of insertion holes 35 are formed in the width direction of the plate portion 33, and two units of them are provided apart from each other in the length direction of the plate portion 33. Regarding the insertion hole 35, just one second bar portion 32 is inserted into one hole.

The second fixing member 22 is held by inserting the second bar portions 32, which are provided to extend from the corresponding plurality of first bar portions 31 to the lid member 12, into the insertion holes 35, which are formed in two rows in the width direction of the plate portion 33 and two units of which are provided apart from each other in the length direction. Four rows of insertion holes 35 of the plate portion 33 are provided at positions corresponding to four rows of second bar portions 32 to be inserted. The second fixing member 22 is mounted on the case member 11 to regulate movement of the terminals 19 in the direction in which the first bar portions 31 extend into the case member 11. For the mounting on the case member 11, specifically, the grooved engaging portion 23 of the case member 11 is engaged with the projecting locking portion 36 of the plate portion 33. By this means, the second fixing member 22 regulates movement of the terminal 19 in the direction in which the first bar portions 31 extend into the case member 11.

In the second fixing member 22, an engaging portion 72 which engages and fixes a locking portion 71 of the inserting member 70, which will be described later, is formed in an end in the direction of the outside of the case member 11 of the plate portion 33.

Further, the second fixing member 22 comprises wall portions 37 which are formed integrally therewith to extend from the surface of the plate portion 33 into the case member 11 and are provided to abut on the surface inside of the case member 11 of the first fixing member 21. The frame A shown in FIG. 13 indicates a region where the wall portion 37 abuts on the first fixing member 21.

Four wall portions 37 are formed such that they sandwich a plurality of second bar portions 32, which are provided in two rows along the direction of extension of the peripheral wall 15' corresponding to the connector mating portion 17 of the case member 11, from both sides in the length direction of the plate portion 33.

The four wall portions 37 of the second fixing member 22 are provided such that the first fixing members 21 abut on the surface of the wall portion 37 on the side of the connector mating portion 17 of the case member 11. This suppresses removal of the terminals 19 and the first fixing members 21 from the connector mating portion 17.

Note that positions of the engaging portions 23 of the case member 11 and positions of the locking portions 36 of the second fixing member 22 are not limited. For example, the engaging portion 23 of the case member 11 may be a groove provided in the bottom plate 14 of the case member 11, and the locking portion 36 of the second fixing member 22 may be formed at a position corresponding to the groove at the edge of the wall portion 37.

The inserting member 70 is formed in a nearly plate shape. The constituent material for the inserting member 70 is not particularly limited, and is preferably made of, for example, an elastic material such as a resin. The inserting member 70 is closely inserted into a gap (space S2, S4) created between the top surface of the first fixing member 21 mounted in the mounting hole 18 of the peripheral wall 15' of the connector mating portion 17 and the peripheral wall 15'.

When the inserting member 70 is closely inserted into the gap (space S2, S4), the surface of the first fixing member 21 abuts on the surface of the inserting member 70. At this point, a locking portion, such as a projection, for locking to the inserting member 70 may be formed on an abutment surface 78 on the inserting member 70 of the first fixing member 21. A locking portion may be formed on the abutment surface of the inserting member 70.

When the inserting member 70 is closely inserted into the gap (space S2, S4), an end toward the inside of the case member 11 of the inserting member 70 is in contact with an end toward the outside of the case member 11 of the second fixing member 22. At this point, the locking portion 71 is formed in the end toward the inside of the case member 11 of the inserting member 70, and is locked to the engaging portion 72 formed in the end toward the outside of the case member 11 of the second fixing member 22. This fixes the inserting member 70 more excellently. In the second embodiment, as shown in FIG. 13, the locking portion 71 of the inserting member 70 is of a male type, and the engaging portion 72 of the second fixing member 22 is of a female type. However, both portions are not limited to these types, the male and female types of both portions may be reversed. A plurality of locking portions 71 and a plurality of engaging portions 72 may be formed. Further, the shapes of the locking portion 71 and the engaging portion 72 are not particularly limited. The inserting member 70 and the second fixing member 22 may be integrally formed. In this case, it is desirable, in terms of operability of insertion of the inserting member into the gap (space S2, S4) and operability of mounting of the second fixing member 22 on the terminal 19, that the inserting member 70 and the second fixing member 22 be integrally formed using an elastic member.

Figure 15:
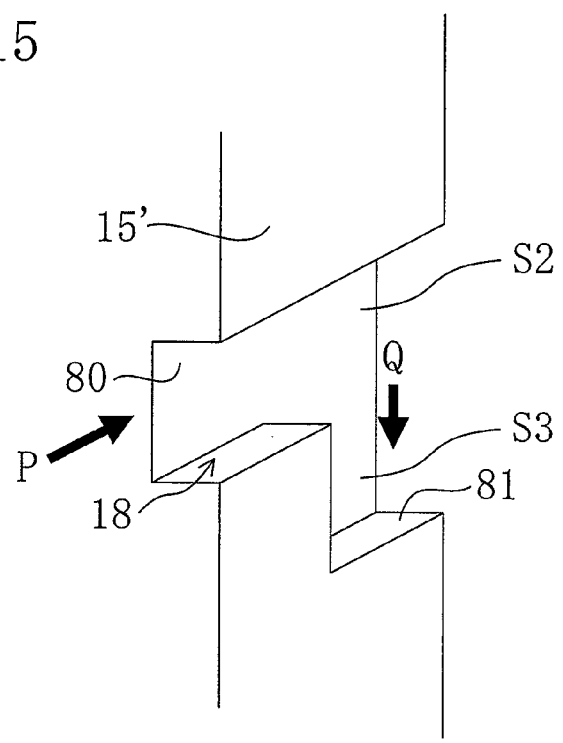
FIG. 15 is an enlarged view of an end of a peripheral wall included in a connector mating portion.

Next, the shape of the mounting hole 18 in the peripheral wall 15' of the connector mating portion 17 on which the above-mentioned first fixing member 21 and the inserting member 70 are mounted is described with reference to FIG. 15. FIG. 15 is an enlarged view of an end of the mounting hole 18 formed in the peripheral wall 15'. Formed in the end of the mounting hole 18 is a projecting portion insertion hole 80 into which the projecting portion 53 of the first fixing member 21 is to be inserted (P of FIG. 15 indicating the insertion direction of the projecting portion 53). The projecting portion insertion hole 80 is formed to proceed straight ahead in the width direction of the peripheral wall 15'. The projecting portion insertion hole 80 is formed up to nearly the center in the width direction of the peripheral wall 15', and, from this position, a projecting portion engaging hole 81 is now formed toward the bottom of the case member 11. The projecting portion engaging hole 81 is a portion to which the projecting portion 53 of the first fixing member 21 is to be finally fed by changing the insertion path of the projecting portion 53 which has been inserted into the projecting portion insertion hole 80 (Q of FIG. 15 indicating the feeding direction of the projecting portion 53).

An electronic unit according to the invention is configured such that the circuit board case 10 with the electrical connector having the above-described configuration is provided with separate connection members, electronic components and the like, and also functions as one unit having a given electrical application.

(Method of Manufacturing Circuit Board Case 10 with Electric Connector)

Next, a description is given of a method of manufacturing the circuit board case 10 with the electrical connector having the above-described configuration. First, a plurality of bar terminals, each of which is linear, and the first fixing member 21 are prepared. Then, the bar terminals are inserted into the corresponding insertion holes 25 of the first fixing member 21. The length in which the bar terminals are inserted into the first fixing members 21 may be arbitrarily set. However, since bending portions are required for the second bar portions 32 to be formed later, it is desirable that the bar terminals be inserted until the first fixing member 21 is positioned closer to either of ends of the bar terminals. At this point, the plurality of bar terminals are inserted such that all the positions of their edges are aligned.

Next, longer portions of the bar terminals extending on both sides of the first fixing member 21 are bent at given positions by approximately 90°. The directions of the bending of all the bar terminals each intersect the length direction of the first fixing member 21 and are the same. The terminal 19 including the first bar portions 31 which are inserted into the first fixing members 21 and the second bar portions 32 which are bent from the first bar portions 31 by approximately 90° and extend is thus completed. Two terminals 19 fixed by the first fixing members 21 in this way are manufactured.

Subsequently, the case member 11 is prepared, and the terminals 19 fixed by the first fixing members 21 manufactured as described above are mounted on the case member 11. Specifically, the terminals 19 fixed by the first fixing members 21 are arranged in the case member 11 such that edges of the first bar portions 31 are toward the connector mating portion 17. At this point, the second bar portions 32 face to a direction in which the lid member 12 is to be mounted. Then, the terminals 19 fixed by the first fixing members 21 are caused to slide, just as they are, toward the connector mating portion 17 so that two first fixing members 21 are inserted into the corresponding, mounting holes 18 of the connector mating portion 17. The positional relationship of the mounting hole 18 of the peripheral wall 15' and the first fixing member 21 at this point is described in more detail with reference to FIGS. 15-19.

Figure 16:
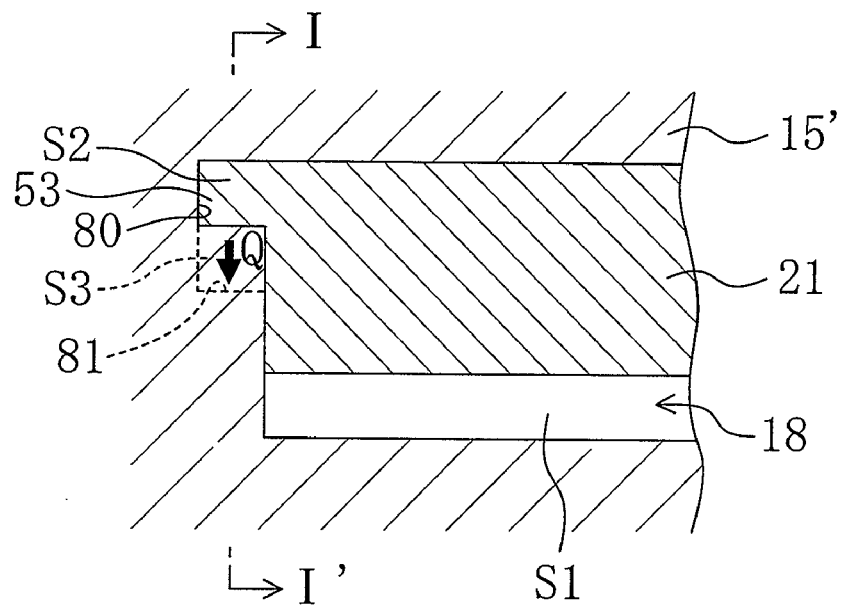
FIG. 16 is a front view of the first fixing member inserted into a mounting hole of the peripheral wall included in the connector mating portion, as seen from the inside of the case member.
Figure 17:
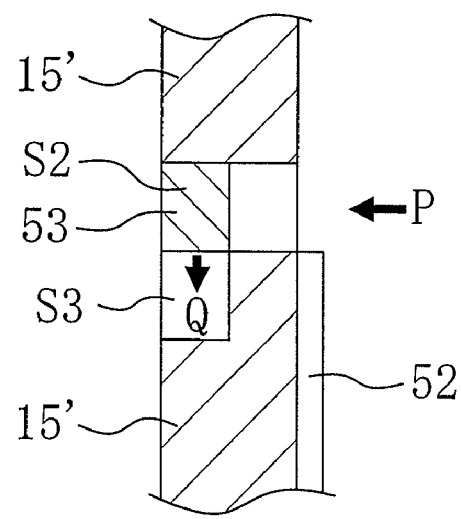
FIG. 17 is a sectional view taken along the line I-I' of FIG. 16.

First, under the condition where the projecting portion 53 corresponds to the projecting portion insertion hole 80 in the end of the peripheral wall 15' shown in FIG. 15, the first fixing member 21 is inserted into the mounting hole 18 of the peripheral wall 15'. Here, FIG. 16 is a front view of the first fixing member 21 inserted into the mounting hole 18 of the peripheral wall 15' as seen from the inside of the case member 11. FIG. 17 is a sectional view taken along the line I-I' of FIG. 16. Next, the first fixing member 21 with the projecting portion 53 inserted into the projecting portion insertion hole 80 is moved straight ahead, just as they are, until the forward stop portion 52 rests against the peripheral wall 15'. At this point, the projecting portion 53 of the first fixing member 21 is inserted into the space S2 formed of the projecting portion insertion hole 80 in an end of the mounting hole 18 of the peripheral wall 15', and space S3 formed of the projecting portion engaging hole 81 is empty. A gap (space S1) is created between the bottom surface of the first fixing member 21 and the mounting hole 18.

Figure 18:
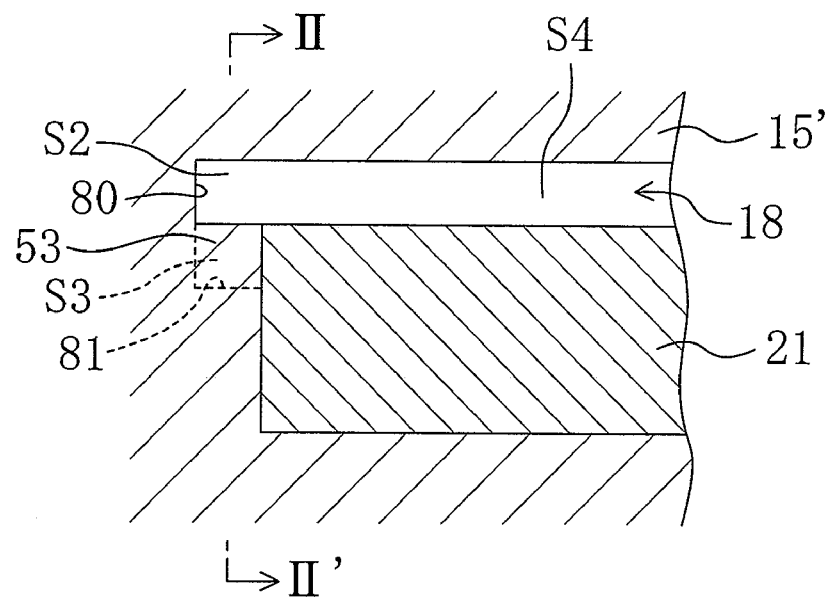
FIG. 18 is a front view of the first fixing member fitted and fixed to the mounting hole of the peripheral wall included in the connector mating portion, as seen from the inside of the case member.
Figure 19:
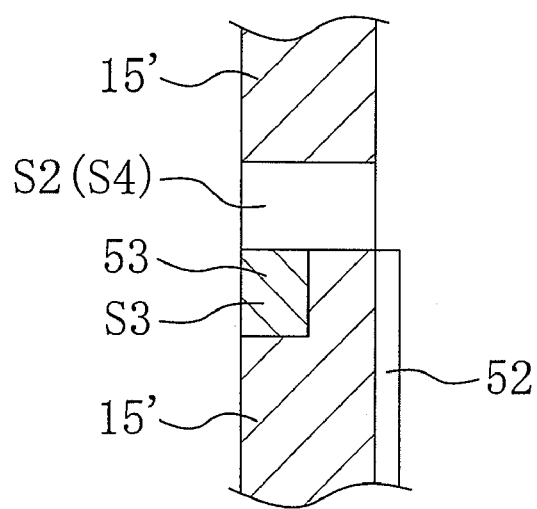
FIG. 19 is a sectional view taken along the line II-II' of FIG. 18.

Subsequently, for the first fixing member 21 with the projecting portion 53 inserted into the projecting portion insertion hole 80, the movement path in the peripheral wall 15' is changed to be toward the bottom surface of the case member 11 such that the projecting portion 53 is fed to the projecting portion engaging hole 81. As a result, the first fixing member 21 is fitted and fixed to the connector mating portion 17. FIG. 18 is a front view of the first fixing member 21 which is fitted and fixed to the connector mating portion 17 by feeding the projecting portion 53 to the projecting portion engaging hole 81, as seen from the inside of the case member 11. FIG. 19 is a sectional view taken along the line II-IP of FIG. 18. At this point, the projecting portion 53 is fit into the projecting portion engaging hole 81 in an end of the mounting hole 18 of the peripheral wall 15', and the space S2 formed of the projecting portion insertion hole 80 is empty. A gap (space S4) is created between the top surface of the first fixing member 21 and the mounting hole 18.

Figure 20:
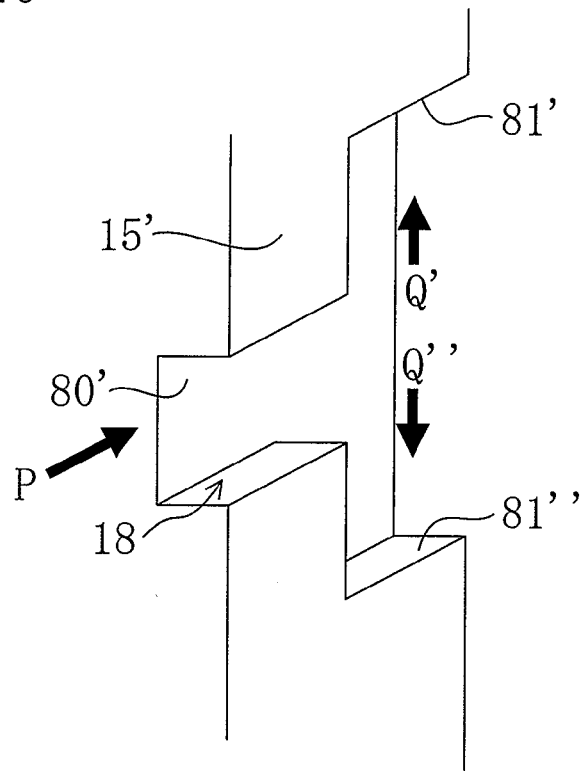
FIG. 20 is an enlarged view of an end of a peripheral wall included in a connector mating portion according to another embodiment.
Figure 21:
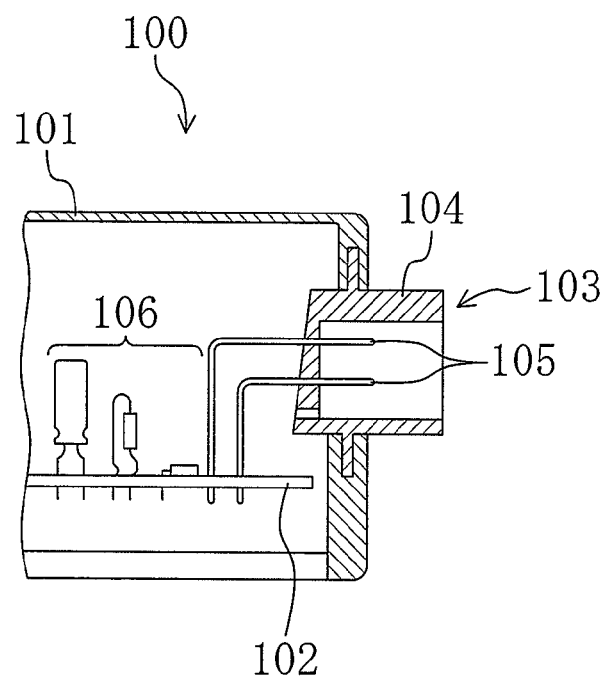
FIG. 21 is a sectional view of a conventional electronic unit in which a case and a housing of a connector are separately formed.
Figure 22:
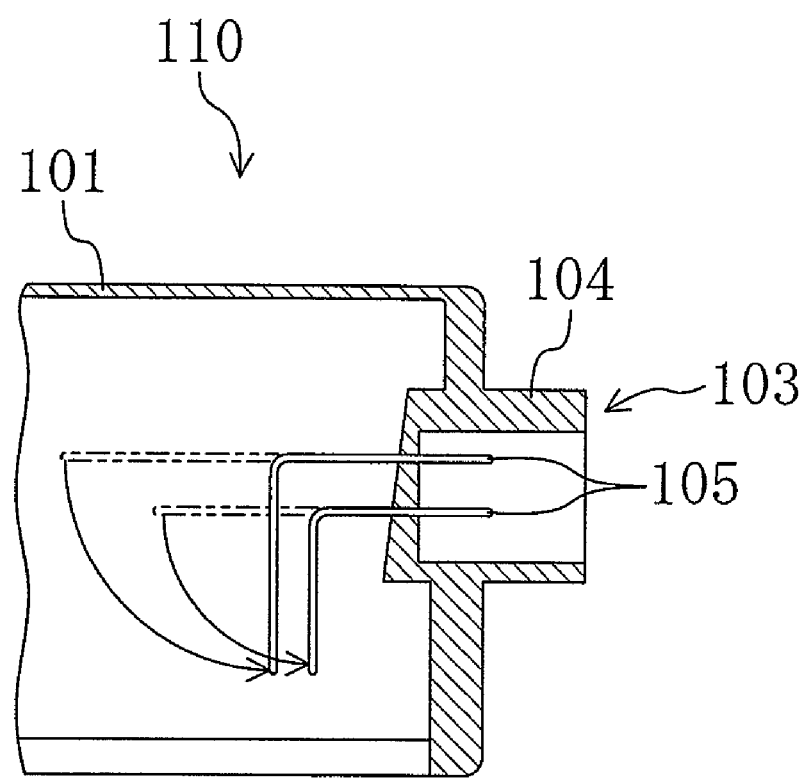
FIG. 22 is a sectional view of a conventional electronic unit in which a case and a housing of a connector are integrally formed.

Note that while, in the second embodiment, the movement path of the first fixing member 21 in the mounting hole 18 of the peripheral wall 15' is changed at a midpoint to be toward the bottom surface of the case member 11 for the projecting portion 53 to be fit into the projecting portion engaging hole 81, the position of the movement path and the position of the projecting portion engaging hole 81 are not limited to those in the second embodiment. For example, as shown in FIG. 20, included in an end of the mounting hole 18 of the peripheral wall 15' may be a projecting portion insertion hole 80', and a projecting portion engaging hole 81' formed at a position from the projecting portion insertion hole 80', which proceeds straight ahead, toward the top surface of the case member 11 and a projecting portion engaging hole 81" formed at a position toward the bottom surface of the case member 11. In this case, the first fixing member 21 having the projecting portion 53 inserted into the projecting portion insertion hole 80' may be moved upward (Q' direction) for the projecting portion 53 to be fed into the projecting portion engaging hole 81', and, alternatively, may be moved downward (Q" direction) for the projecting portion 53 to be fed into the projecting portion engaging hole 81". Further, the movement path may not be in parallel to the direction in which the peripheral wall 15' stands up, and may be formed in a diagonal direction. The movement path may also include a plurality of bend portions.

The projecting portion 53 is fit into the projecting portion engaging hole 81 as described above, so that the first fixing member 21 is fixed within the peripheral wall 15'. The terminal 19 fixed by the first fixing member 21 is thereby fixed within the case member 11.

Next, the inserting member 70 is closely inserted into the gap (space S4) created between the top surface of the first fixing member 21 and the mounting hole 18 from the inside of the case member 11.

Subsequently, the second bar portions 32 of the terminals 19 fixed within the case member 11 are covered with the second fixing member 22 such that a plurality of second bar portions 32 are inserted into the corresponding insertion holes 35 of the plate portion 33 and are held with the edges of the second bar portions 32 projecting from the plate portion 33 by a given length.

At this point, the grooved engaging portions 23 of the case member 11 are engaged with the projecting locking portions 36 formed on both ends in the length direction of the plate portion 33. The wall portions 37 of the second fixing member 22 are provided so as to sandwich, in the length direction of the plate portion 33, a plurality of second bar portions 32 provided in four rows at each of two locations at regular intervals along the direction of extension of the peripheral wall 15' corresponding to the connector mating portion 17 of the case member 11. The four wall portions 37 of the second fixing member 22 are provided such that the first fixing members 21 abut on the surfaces of the wall portions 37 on the side of the connector mating portion 17 of the case member 11.

Next, the locking portion 71 of the inserting member 70 is locked and fixed to the engaging portion 72 of the second fixing member 22.

Thus, installation of the connection member 13 into the case member 11 is completed.

Subsequently, the circuit board 50 including the electronic component 24 and a conductive pattern (not shown) of copper foil or the like electrically connected to the electronic component 24, and the lid member 12 are prepared.

Here, a circuit pattern is formed on an insulating substrate and further the electronic component 24 is mounted on it, so that the circuit board 50 is formed. A circuit pattern may be formed by pattern printing using conductive ink on an insulating substrate. A circuit pattern may also be formed by patterning a conductive material by means of photolithography technology after an insulating substrate is covered with a conductive material. Further, a circuit pattern may be formed by attaching onto an insulating substrate a conductive material which has been previously punched into the circuit pattern.

Next, the circuit board 50 is mounted onto the lid member 12. Further, the electronic component 24 and the like of the circuit board 50 face the case member 11, and the circuit board 50 and the lid member 12 are mounted and fixed onto the case member 11 with packing made of rubber or the like interposed therebetween. Thus, the circuit board case 10 with the electrical connector is completed.

(Operational Advantage)

Next, the circuit board case 10 with the electrical connector according to the second embodiment of the invention is described. In the circuit board case 10 with the electrical connector according to the second embodiment of the invention, the connector mating portion 17 includes the peripheral wall 15' standing up in the depth direction of the case member 11, and the peripheral wall 15' has the projecting portion insertion hole 80 into which the projecting portion 53 of the first fixing member 21 is inserted and the projecting portion engaging hole 81 to which the projecting portion 53 inserted into the projecting portion insertion hole 80 is to be fed with the movement path within the peripheral wall 15' changed.

With this configuration, at the time of fitting and fixing the first fixing member 21 to the connector mating portion 17, first, the projecting portion 53 of the first fixing member 21 is inserted into the projecting portion insertion hole 80 formed in the peripheral wall 15' of the connector mating portion 17. Then, the projecting portion 53 of the first fixing member 21 inserted into the projecting portion insertion hole 80 is fed to the projecting portion engaging hole 81, with the movement path changed within the peripheral wall 15'. Therefore, the movement path is changed after the projecting portion 53 of the first fixing member 21 has been inserted within the peripheral wall 15', which effectively suppresses return of the projecting portion 53 to the insertion direction. Accordingly, it is possible to excellently suppress detachment of the first fixing member 21 from the connector mating portion 17, and the connector mating portion 17 of the first fixing member 21 can be fit into the mounting hole 18 with good accuracy by simple work. Further, when the projecting portion 53 of the first fixing member 21 inserted into the projecting portion insertion hole 80 has been fed to the projecting portion engaging hole 81 with the movement path changed within the peripheral wall 15', the space S4 which has not existed upon insertion is created between the first fixing member 21 and the mounting hole 18 of the peripheral wall 15'. Specifically, in cases where the projecting portion 53 of the first fixing member 21 is fed to the projecting portion engaging hole 81 with the movement path changed to be toward the bottom of the case member 11 within the peripheral wall 15', the space S4 which has not existed upon insertion is created above the first fixing member 21. Therefore, in order to check if the first fixing member 21 is fit into its proper position of the connector mating portion 17, only examining the existence of the space S4 is required. The checking can be readily performed without using a sensor, and without the need for skill and the like.

Industrial Applicability

As described above, the invention is useful for a circuit board case with an electrical connector and an electronic unit provided with it.

DESCRIPTION OF REFERENCE CHARACTERS

10 Circuit Board Case with Electrical Connector
11 Case Member
12 Lid Member
13 Connection Member
15,15' Peripheral Wall
17 Connector Mating Portion
18 Mounting Hole
19 Terminal
21 First Fixing Member
22 Second Fixing Member
23 Engaging Portion
24 Electronic Component
25 Insertion Hole
28 Press-Fit Hole
31 First Bar Portion
32 Second Bar Portion
33 Plate Portion
35 Insertion Hole
36 Locking Portion
37 Wall Portion
50 Circuit Board
51 Accommodation Portion
52 Forward Stop Portion
53 Projecting Portion
60,61 Elongated Hole
63 Locking Portion
70 Inserting Member
71 Locking Portion
72 Engaging Portion
78 Abutment Surface
80,80' Projecting Portion Insertion Hole
81,81', 81" Projecting Portion Engaging Hole

The invention claimed is:

1. A circuit board case with an electrical connector, comprising:
   a case member having formed thereon a connector mating portion to be mated with a counterpart electrical connector;
   a circuit board being accommodated in the case member and having an electronic component mounted thereon;
   a lid member mounted on the case member; and
   a connection member accommodated in the case member and mounted on the connector mating portion to electrically connect the counterpart connector and the circuit board,
   the connection member including;
      a terminal comprising a first bar portion electrically connected with a terminal of the counterpart connector, and a second bar portion formed integrally with the first bar portion and extending toward the lid member;
      a first fixing member holding the first bar portion of the terminal and being mounted on the connector mating portion of the case member to fix the terminal; and
      a second fixing member having an insertion hole formed therein, the second fixing member holding the second bar portion by inserting the second bar portion into the insertion hole, and being mounted on the case member to regulate movement of the terminal in a direction in which the first bar portion extends into the case member.

2. The circuit board case with the electrical connector of claim 1, wherein the second fixing member is provided with a locking portion and the case member is provided with an engaging portion, the engaging portion of the case member being engaged with the locking portion of the second fixing member, so that movement of the terminal in the direction in which the first bar portion extends into the case member is regulated.

3. The circuit board case with the electrical connector of claim 2, wherein the second fixing member includes a plate portion provided with the insertion hole passing therethrough in a thickness direction, the plate portion being formed to extend in a direction crossing the direction in which the first bar portion extends into the case member, and the locking portion of the second fixing member is provided in at least one end in a longitudinal direction of the plate portion.

4. The circuit board case with the electrical connector of claim 3, wherein a plurality of second bar portions of the terminal and a plurality of insertion holes of the plate portion are provided, and just one of the plurality of second bar portions is inserted into each of the insertion holes of the plate portion.

5. The circuit board case with the electrical connector of claim 3, wherein a plurality of second bar portions of the terminal are provided, the insertion hole of the plate portion is formed such that a plurality of elongated holes formed to extend in a width direction of the plate portion are arranged in a length direction of the plate portion, and a given number of ones of the second bar portions are inserted into each of the elongated holes of the plate portion.

6. The circuit board case with the electrical connector of claim 3, wherein a plurality of second bar portions of the terminal are provided, the insertion hole of the plate portion is formed such that a plurality of elongated holes formed to extend in a length direction of the plate portion are arranged in a width direction of the plate portion, and a given number of ones of the second bar portions are inserted into each of the elongated holes of the plate portion.

7. The circuit board case with the electrical connector of claim 3, wherein the second fixing member includes a wall portion fprmed to extend from a surface of the plate portion into the case member, the wall portion being provided to abut on a surface inside of the case member of the first fixing member.

8. The circuit board case with the electrical connector of claim 1, wherein the first fixing member includes an accommodation portion accommodated within the connector mating portion of the case member, and a forward stop portion formed in a step shape in an end of the accommodation portion, the forward stop portion abutting on the connector mating portion to regulate movement of the first fixing member toward the connector mating portion.

9. The circuit board case with the electrical connector of claim 1, wherein the first fixing member includes a locking portion for locking to an interior wall of the connector mating portion of the case member.

10. The circuit board case with the electrical connector of claim 1, wherein a projecting portion is formed in an end of the first fixing member, and the connector mating portion includes a peripheral wall standing up in a depth direction of the case member, the peripheral wall having a projecting portion insertion hole to which the projecting portion of the first fixing member is inserted and a projecting portion engaging hole to which the projecting portion inserted into the projecting portion insertion hole is fed with a movement path within the peripheral wall changed.

11. The circuit board case with the electrical connector of claim 10, wherein the projecting portion engaging hole of the peripheral wall is provided at a position to which the projecting portion of the first fixing member inserted into the projecting portion insertion hole of the peripheral wall is fed with the movement path within the peripheral wall changed to be toward a bottom of the case member.

12. The circuit board case with the electrical connector of claim 10, wherein the first fixing member includes an accommodation portion accommodated within the connector mating portion of the case member, and a forward stop portion formed in a step shape in an end of the accommodation portion, the forward stop portion abutting on the connector mating portion to regulate movement of the first fixing member toward the connector mating portion.

13. The circuit board case with the electrical connector of claim 10, wherein an inserting member is inserted into a gap between the peripheral wall of the connector mating portion and the first fixing member fed to the projecting portion engaging hole of the peripheral wall such that the projecting portion is locked.

14. The circuit board case with the electrical connector of claim 13, wherein on either one of an abutment surface on the inserting member of the first fixing member and an abutment surface on the first fixing member of the inserting member, a locking portion for locking the either one to another of the abutment surfaces is formed.

15. The circuit board case with the electrical connector of claim 13, wherein the inserting member is formed of an elastic material.

16. The circuit board case with the electrical connector of claim 13, wherein a locking portion is formed in an end toward an inside of the case member of the inserting member, and an engaging portion which engages and fixes the locking portion of the inserting member is formed in an end toward an outside of the case member of the second fixing member.

17. The circuit board case with the electrical connector of anyone of claim 10, wherein the second fixing member is provided with a locking portion and the case member is provided with an engaging portion, the engaging portion of the case member being engaged with the locking portion of the second fixing member, so that movement of the terminal in the direction in which the first bar portion extends into the case member is regulated.

18. The circuit board case with the electrical connector of claim 17, wherein the second fixing member includes a plate portion provided with the insertion hole passing therethrough in a thickness direction, the plate portion being formed to extend in a direction crossing the direction in which the first bar portion extends into the case member, and the locking portion of the second fixing member is provided in at least one end in a longitudinal direction of the plate portion.

19. The circuit board case with the electrical connector of claim 18, wherein the second fixing member comprises a wall portion formed to extend from a surface of the plate portion into the case member, the wall portion being provided to abut on a surface inside of the case member of the first fixing member.

20. An electronic unit comprising:
the circuit board case with the electrical connector of claim 1.

* * * * *

UNITED STATES PATENT AND TRADEMARK OFFICE
CERTIFICATE OF CORRECTION

PATENT NO. : 8,269,116 B2  
APPLICATION NO. : 12/864177  
DATED : September 18, 2012  
INVENTOR(S) : Ambo et al.

It is certified that error appears in the above-identified patent and that said Letters Patent is hereby corrected as shown below:

Title page, (item 54 Title) at line 1, and in column 1 at line 1, change "ELECTRIC" to --ELECTRICAL--.

In column 19 at line 40, change "II-IP" to --II-II'--.

In column 22 at line 27, In Claim 1, change "including;" to --including:--.

In column 23 at line 20, In Claim 7, change "fprmed" to --formed--.

In column 24 at line 29, In Claim 17, before "claim" delete "anyone of".

Signed and Sealed this  
Nineteenth Day of March, 2013

Teresa Stanek Rea  
*Acting Director of the United States Patent and Trademark Office*